(12) United States Patent
Nien et al.

(10) Patent No.: US 12,230,318 B2
(45) Date of Patent: Feb. 18, 2025

(54) MEMORY DEVICE INCLUDING A WORD LINE WITH PORTIONS WITH DIFFERENT SIZES IN DIFFERENT METAL LAYERS

(71) Applicant: TAIWAN SEMICONDUCTOR MANUFACTURING CO., LTD., Hsinchu (TW)

(72) Inventors: Yi-Hsin Nien, Hsinchu (TW); Wei-Chang Zhao, Hsinchu (TW); Chih-Yu Lin, Taichung (TW); Hidehiro Fujiwara, Hsinchu (TW); Yen-Huei Chen, Hsinchu County (TW); Ru-Yu Wang, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 188 days.

(21) Appl. No.: 17/871,635

(22) Filed: Jul. 22, 2022

(65) Prior Publication Data
US 2022/0359002 A1  Nov. 10, 2022

Related U.S. Application Data

(63) Continuation of application No. 17/035,118, filed on Sep. 28, 2020, now Pat. No. 11,404,113.

(60) Provisional application No. 63/040,537, filed on Jun. 18, 2020.

(51) Int. Cl.
G11C 11/419 (2006.01)
G11C 5/06 (2006.01)
G11C 11/412 (2006.01)

(52) U.S. Cl.
CPC ............. *G11C 11/419* (2013.01); *G11C 5/06* (2013.01); *G11C 11/412* (2013.01)

(58) Field of Classification Search
None
See application file for complete search history.

(56) References Cited

U.S. PATENT DOCUMENTS

| 9,646,974 | B1 | 5/2017 | Liaw |
| 10,134,737 | B2 | 11/2018 | Singh et al. |
| 10,262,935 | B2 | 4/2019 | Kim et al. |
| 10,461,086 | B2 | 10/2019 | Liaw |

(Continued)

FOREIGN PATENT DOCUMENTS

| CN | 107039061 A | 8/2017 |
| CN | 107230492 A | 10/2017 |

(Continued)

*Primary Examiner* — J. H. Hur
(74) *Attorney, Agent, or Firm* — Maschoff Brennan

(57) ABSTRACT

A memory device includes a first word line and a second word line. A first portion of the first word line is formed in a first metal layer, a second portion of the first word line is formed in a second metal layer above the first metal layer, and a third portion of the first word line is formed in a third metal layer below the second metal layer. A first portion of the second word line is formed in the first metal layer. A second portion of the second word line is formed in the second metal layer. The first portion, the second portion, and the third portion of the first word line have sizes that are different from each other, and the first portion and the second portion of the second word line have sizes that are different from each other.

20 Claims, 16 Drawing Sheets

(56) References Cited

U.S. PATENT DOCUMENTS

| | | |
|---|---|---|
| 11,404,113 B2 * | 8/2022 | Nien .................. H01L 27/0207 |
| 2010/0038616 A1 | 2/2010 | Nagashima et al. |
| 2011/0068373 A1 | 3/2011 | Minemura et al. |
| 2011/0204309 A1 | 8/2011 | Nitta |
| 2013/0272056 A1 | 10/2013 | Liaw |
| 2014/0347908 A1 | 11/2014 | Liaw |
| 2014/0369112 A1 | 12/2014 | Liaw |
| 2016/0180929 A1 | 6/2016 | Kang et al. |
| 2016/0314831 A1 | 10/2016 | Liaw |
| 2016/0372182 A1 | 12/2016 | Liaw |
| 2018/0175108 A1 | 6/2018 | Terada |
| 2019/0165260 A1 | 5/2019 | Yu et al. |
| 2020/0020411 A1 | 1/2020 | Terada et al. |
| 2020/0020700 A1 | 1/2020 | Lin et al. |
| 2020/0106002 A1 | 4/2020 | Song et al. |
| 2020/0176473 A1 | 6/2020 | Yamazaki et al. |

FOREIGN PATENT DOCUMENTS

| | | |
|---|---|---|
| CN | 108206033 A | 6/2018 |
| TW | 201926337 A | 7/2019 |
| TW | 202006929 A | 2/2020 |
| TW | 202018934 A | 5/2020 |

* cited by examiner

MEMORY DEVICE INCLUDING A WORD LINE WITH PORTIONS WITH DIFFERENT SIZES IN DIFFERENT METAL LAYERS

CROSS-REFERENCE TO RELATED APPLICATION(S)

This application is a continuation of U.S. application Ser. No. 17/035,118, filed Sep. 28, 2020, now U.S. Pat. No. 11,404,113, issued Aug. 2, 2022, which claims the benefit of U.S. Provisional Application Ser. No. 63/040,537, filed Jun. 18, 2020, which is herein incorporated by reference.

BACKGROUND

Static random access memory (SRAM) is one type of semiconductor memory having an array of memory cells. Memory cells arranged in a corresponding row or column are accessed through a corresponding word line and a corresponding bit line. Data may be read from or written to the memory cells through operations of the word lines and the bit lines. The SRAM is designed according to routings, for example, including geometry size or arrangement of the word lines.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
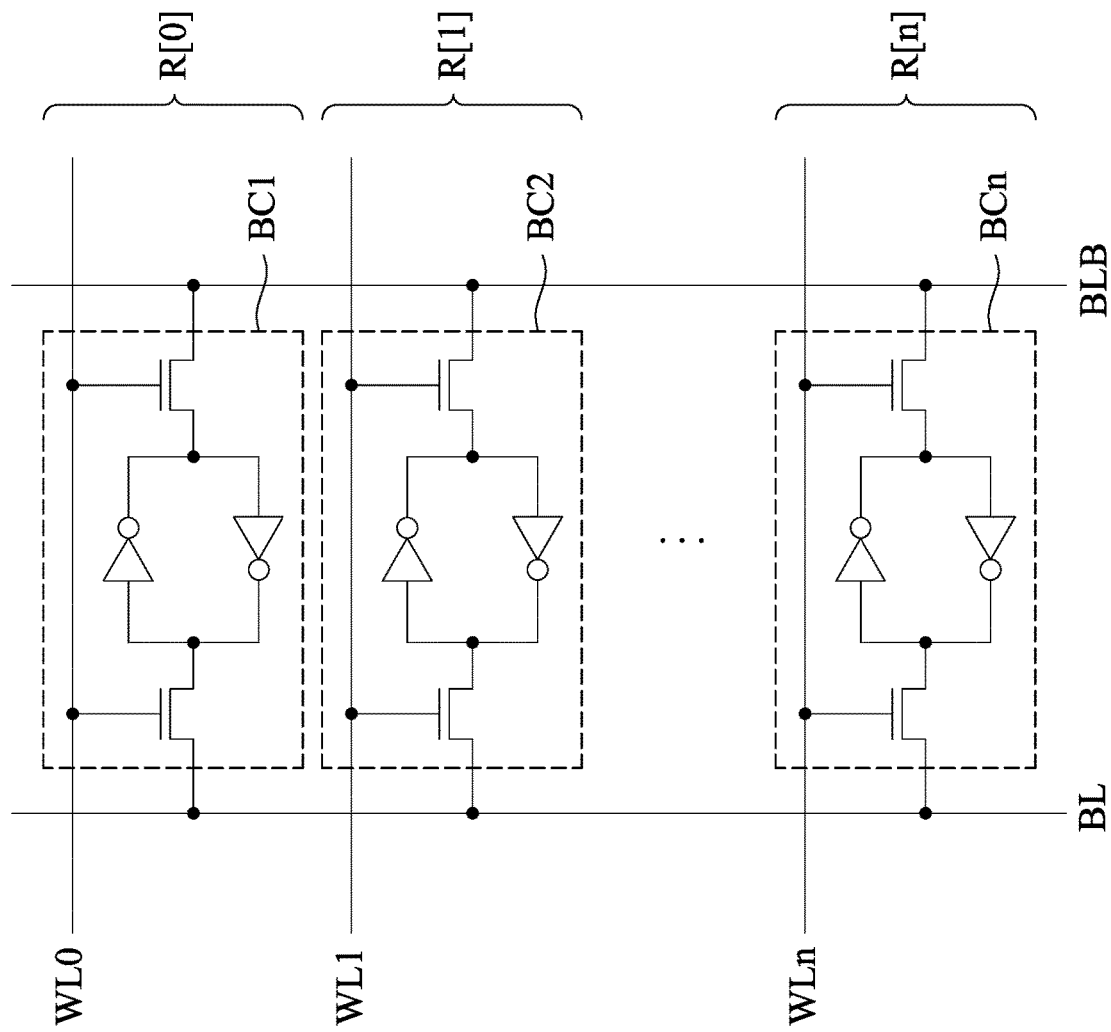
FIG. 1 is a circuit diagram illustrating a memory device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

In this document, the term "coupled" may also be termed as "electrically coupled", and the term "connected" may be termed as "electrically connected". "Coupled" and "connected" may also be used to indicate that two or more elements cooperate or interact with each other.

Furthermore, spatially relative terms, such as "underlying," "below," "lower," "overlying," "upper" and the like, may be used throughout the description for ease of understanding to describe one element or feature's relationship to another element(s) or feature(s) as illustrated in the figures. The spatially relative terms are intended to encompass different orientations of the device in use or operation in addition to the orientation depicted in the figures. The structure may be otherwise oriented (e.g., rotated 90 degrees or at other orientations) and the spatially relative descriptors used herein may likewise be interpreted accordingly.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

FIG. 1 illustrates a circuit diagram of a memory device 100, in accordance with some embodiments of the present disclosure. Bit cells BC0, BC1, . . . , and BCn are arranged in a same column and respective rows R[0], R[1], . . . , and R[n]. For simplicity of illustration, only one column and few bit cells BC0, BC1, . . . , and BCn are shown in FIG. 1, the memory device 100 may include other bit cells arranged in other columns and rows. Also, only one bit line BL and one complementary bit line BLB are shown in FIG. 1 for illustration. Each of the bit cells BC0, BC1, . . . , and BCn are coupled to the bit line BL and the complementary bit line BLB, and are also coupled to respective word lines WL0, WL1, . . . , and WLn. For simplicity, each of the bit cells BC0, BC1, and BCn is referenced as BC hereinafter for illustration, because the bit cells BC0, BC1, . . . , and BCn operate in a similar way in some embodiments. Based on the similar reasons, the each of the WL0, WL1, . . . , and WLn is referenced as WL hereinafter.

Each of the bit cells BC includes a pair of invertors and two transistors. The pair of invertors in each of the bit cells BC are coupled together and also coupled to the transistors. The transistors in each of the bit cells BC are further coupled to the bit line BL, the complementary bit line BLB and the corresponding word line WL. In some embodiments, for each of the bit cells, the pair of invertors are configured to store bit data. The transistors are configured to activate the pair of invertors and to write or read the bit data, in response to a word line signal and a bit line signal. The word line signal is transmitted through the corresponding word line WL, and the bit line signal is transmitted through the bit line BL and the complementary bit line BLB. In some other embodiments, each of the bit cells BC is a static random access memory (SRAM) cell formed by six transistors (6T-SRAM). In various embodiments, each of the bit cells BC is implemented by a single port SRAM cell. In alternative embodiments, each of the bit cells BC is implemented by a dual port SRAM cell. Each of the bit cells BC can be formed by other equivalent SRAM cells, and various configurations of the bit cells BC are within the contemplated scope of the present disclosure.

Each of the word lines WL is split among various levels of the memory device 100, in some embodiments. For each of the word lines WL, the separated portions are formed in different metal layers of the memory device 100, and are coupled together to transmit the corresponding word line signal. By arranging separated portions of the word lines WL among various metal layers, at least one of the separated portions in one of the metal layers is widened to have a broaden area, in compliance with a design rule for generating a layout design of the memory device 100. In some embodiments, two adjacent word lines WL are considered as a group having a specific configuration of these separated portions. For example, as illustrated in FIG. 1, the word lines WL0 and WL1 are considered as one group, and the word lines WL2 and WL3 (not shown) are considered as another group. Each of the groups has the same configuration for arranging the corresponding separated portions of the word lines WL, and such configuration is further illustrated in cross-section diagrams and layout diagrams as discussed below.

Figure 2A:
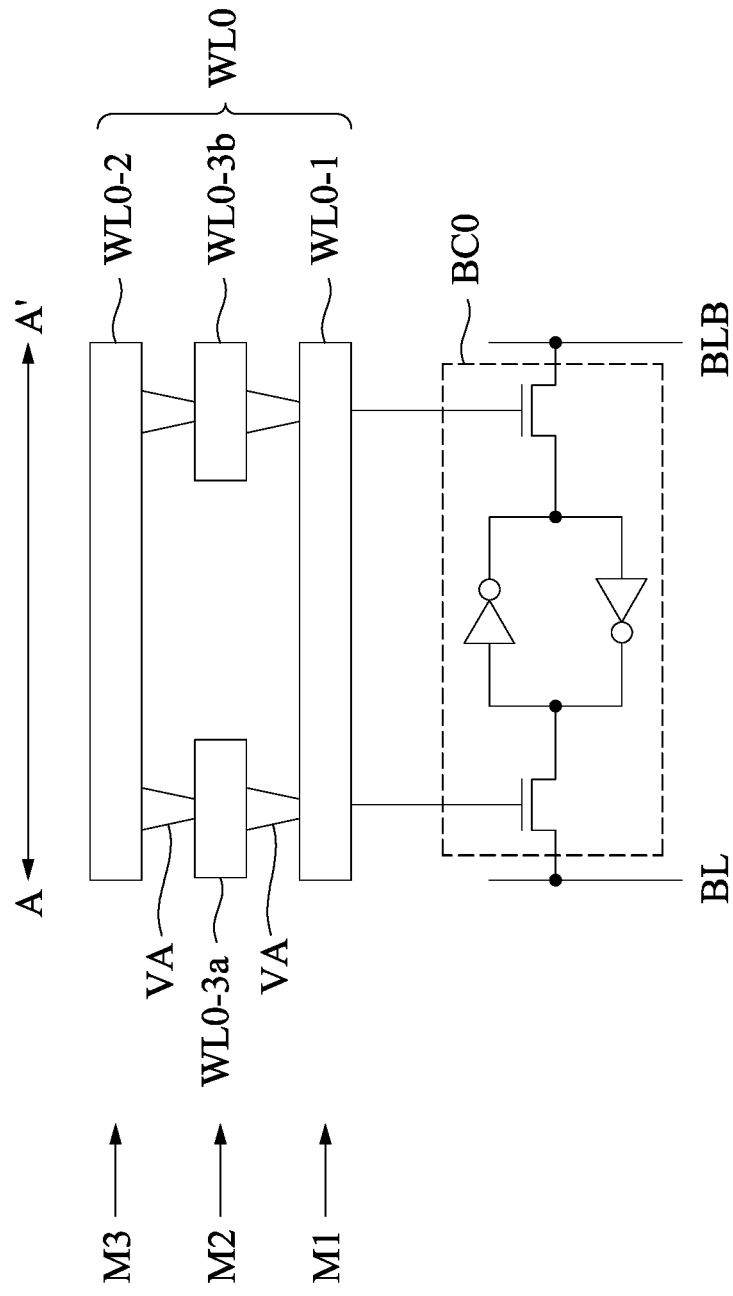
FIGS. 2A and 2B are cross-section schematic diagrams of parts of a memory device corresponding to the memory device shown in FIG. 1, in accordance with some embodiments of the present disclosure.
Figure 2B:
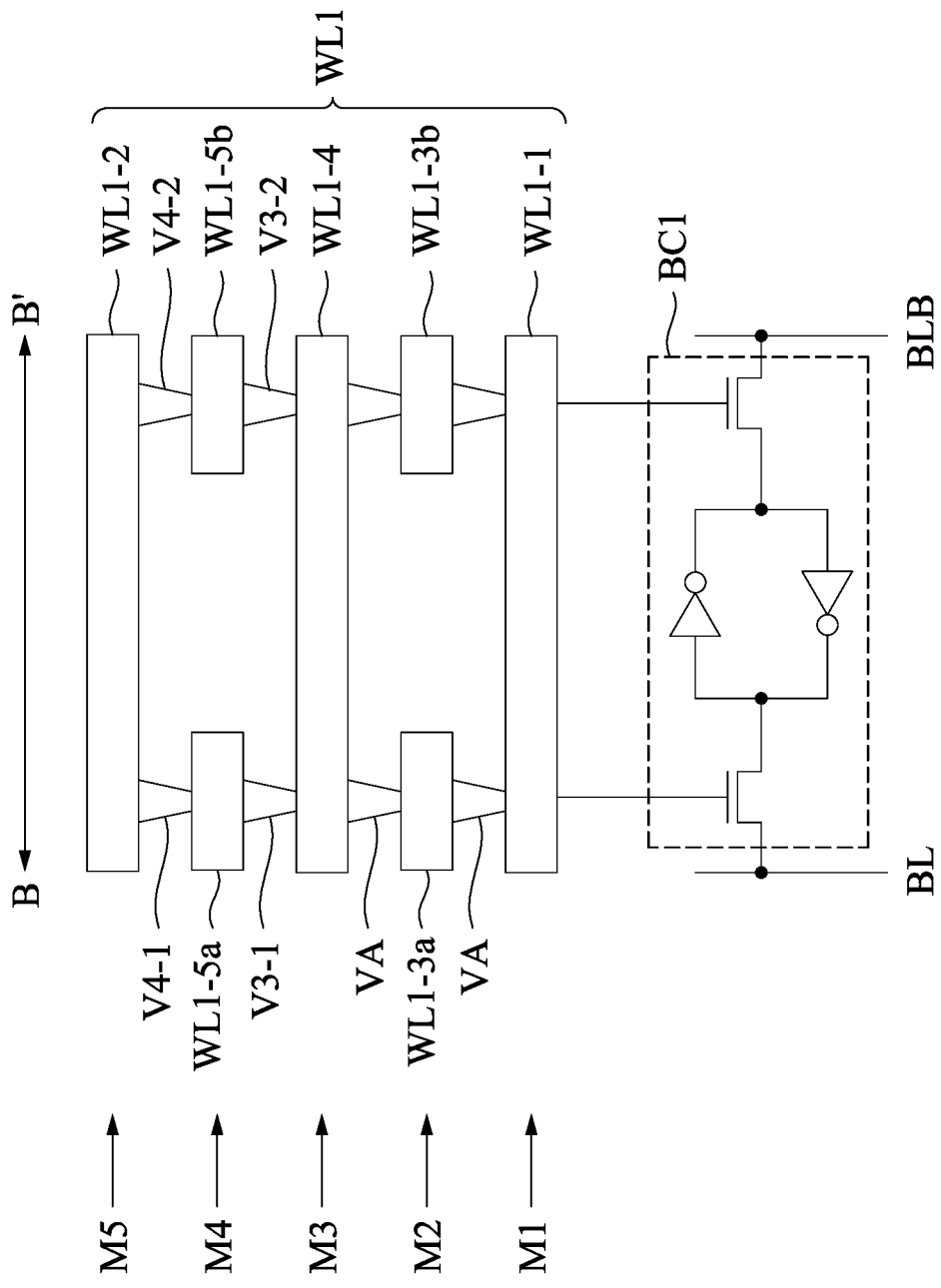

Reference is made to FIGS. 2A and 2B. FIGS. 2A and 2B are cross-section schematic diagrams of parts of a memory device 200 corresponding to the memory device 100 shown in FIG. 1, in accordance with some embodiments of the present disclosure. For ease of understanding, the embodiments with respect to FIG. 2A are discussed with reference to FIG. 2B. With respect to the embodiments of FIG. 1, like elements in FIGS. 2A and 2B are designated with the same reference numbers for ease of understanding.

As illustrated in FIG. 2A, the bit cell BC0 is coupled to the word line WL0. The bit cell BC0 corresponds to the bit cell BC0 shown in FIG. 1, and the word line WL0 corresponds to the word line WL0 shown in FIG. 1, in some embodiments. The word line WL0 has portions WL0-1, WL0-2, WL0-3a and WL0-3b and vias VA. These portions WL0-1, WL0-2, WL0-3a and WL0-3b are separated and disposed in continuous metal layers M1, M2 and M3. The vias VA are disposed between two adjacent of the metal layers M1-M3 to couple the portions WL0-1, WL0-2, WL0-3a and WL0-3b together. For simplicity of illustration, only one via VA is labeled in FIG. 2A or other respective figures illustrated in some embodiments of the present disclosure. The portions of the corresponding word lines WL illustrated in some embodiments of the present disclosure are also referred to as segments hereinafter.

The segment WL0-1 is formed in the M1 layer. The segments WL0-3a and WL0-3b are formed in the M2 layer above the M1 layer. The segment WL0-2 is formed in the M3 layer above the M2 layer. The segment WL0-1 is coupled to the transistors of the bit cell BC0, and is further coupled through vias VA to the segments WL0-3a and WL0-3b. The segments WL0-3a and WL0-3b are coupled through vias VA to the segment WL0-2. In some embodiments, the segment WL0-3b is identical to the segment WL0-3a that having the same structure configurations. With such configurations, the segments WL0-1, WL0-3a and WL0-3b, and WL0-2 are coupled in parallel with one another.

As illustrated in FIG. 2B, the bit cell BC1 is coupled to the word line WL1. The bit cell BC1 corresponds to the bit cell BC1 shown in FIG. 1, and the word line WL1 corresponds to the word line WL1 shown in FIG. 1, in some embodiments. The word line WL1 has segments WL1-1, WL1-2, WL1-3a, WL1-3b, WL1-4, WL1-5a and WL1-5b, and the vias VA, V3-1, V3-2, V4-1 and V4-2. The segments WL1-1, WL1-2, WL1-3a, WL1-3b, WL1-4, WL1-5a and WL1-5b of the word line WL1 are disposed in continuous metal layers M1-M5 and are coupled together. The vias VA are disposed between the M1 and the M2 layers, and between the M2 and the M3 layers. The vias V3-1 and V3-2 are disposed between the M3 and the M4 layers. The vias V4-1 and V4-2 are disposed between the M4 and the M5 layers.

The segment WL1-1 is formed in the M1 layer. The segments WL1-3a and WL1-3b are separated and are formed in the M2 layer. The segment WL1-4 is formed in the M3 layer. The segments WL1-5a and WL1-5b are separated and are formed in the M4 layer above the M3 layer. The segment WL1-2 is formed in the M5 layer above the M4 layer. The segment WL1-1 is coupled to the transistors of the bit cell BC1, and is further coupled through vias VA to the segments WL1-3a and WL1-3b. The segments WL1-3a and WL1-3b are coupled through vias VA to the segment WL1-4. The segment WL1-4 is coupled through vias V3-1 and V3-2 to the segments WL1-5a and WL1-5b. The segments WL1-5a and WL1-5b are coupled through vias V4-1 and V4-2 to the segment WL1-2. With such configurations, the segments WL1-1, WL1-3a and WL1-3b, WL1-4, WL1-5a and WL1-5b, and WL1-2 are coupled in parallel with one another.

In some embodiments, the segment WL1-3b is identical to the segment WL1-3a. The segments WL1-5a and WL1-5b have structure configurations that are the same; the vias V3-1 and V3-2 have the same structure configurations; and the vias V3-1 and V3-2 also have the same structure configurations.

The number and arrangement of the metal layers M1-M5 shown in FIGS. 2A and 2B are given for illustrative purposes. Various numbers and arrangements of the metal layers M1-M5 to implement the memory device 200 in FIGS. 2A and 2B are within the contemplated scope of the present disclosure. For example, in some embodiments, only one segment WL0-3a of the word line WL0 is in the M2 layer, for coupling the remaining segments WL0-1 and WL0-2 together.

Figure 3:
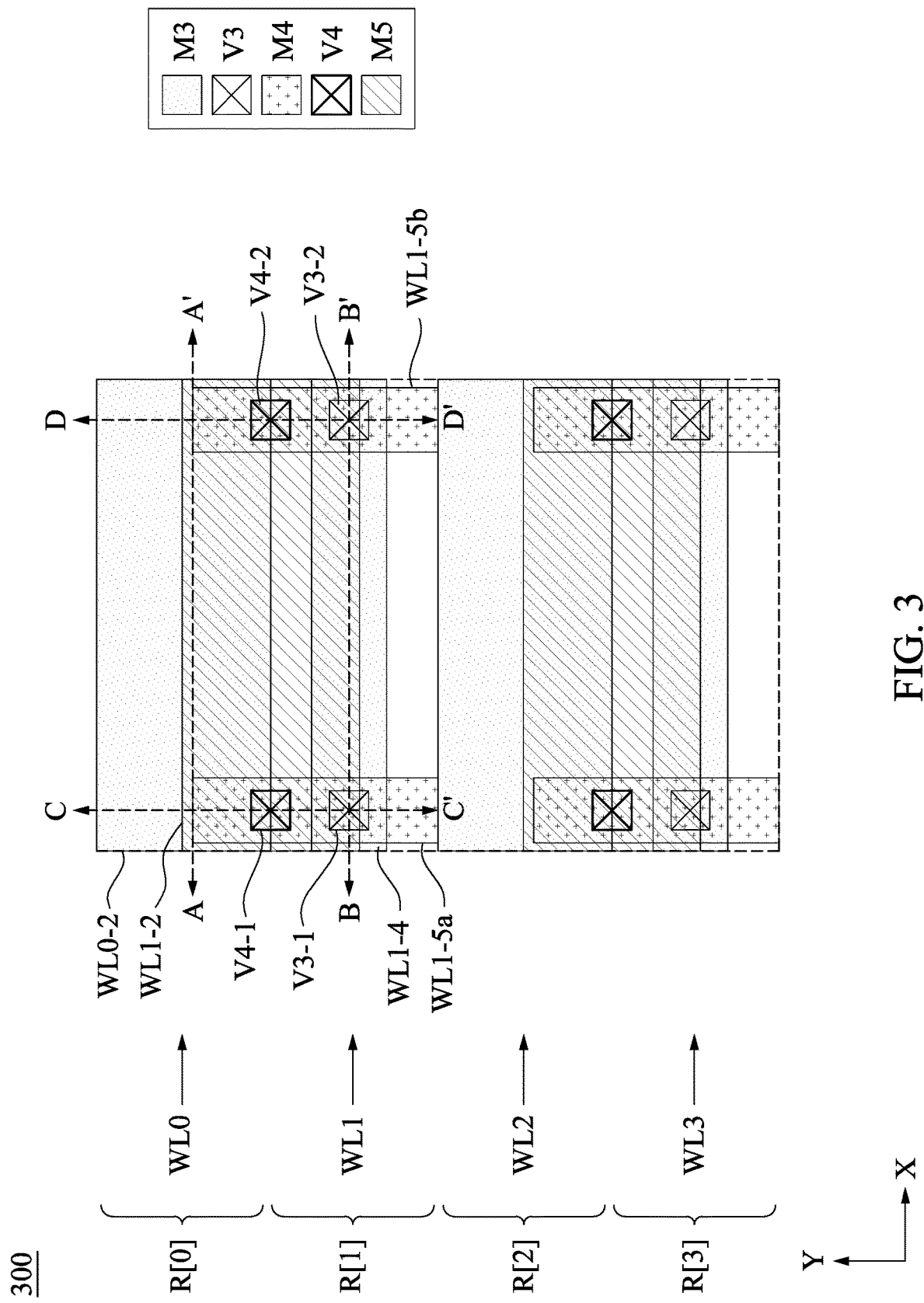
FIG. 3 is a schematic layout diagram of parts of a memory device corresponding to the memory device shown in FIGS. 2A and 2B, in accordance with some embodiments of the present disclosure.

Reference is made to FIG. 3. FIG. 3 is a schematic layout diagram 300 of parts of a memory device corresponding to the memory device 200 shown in FIGS. 2A and 2B, in accordance with some embodiments of the present disclosure. The cross line A-A' corresponds to the cross line A-A' shown in FIG. 2A, and the cross line B-B' corresponds to the cross line B-B' shown in FIG. 2B, in some embodiments. For ease of understanding, the embodiments with respect to FIG. 3 are discussed with reference to FIGS. 2A and 2B, and only illustrate elements that are associated with the word lines WL0-WL3. With respect to the embodiments of FIGS. 2A and 2B, like elements in FIG. 3 are designated with the same reference numbers for ease of understanding.

As illustrated in FIG. 3, the layout diagram 300 illustrates a plan view, viewing a part of the memory device formed in the M3-M5 layers. The word lines WL0, WL1, WL2 and WL3 are arranged in a same column and the rows R[0], R[1], R[2] and R[3] respectively. As illustrated in FIG. 3, cross section views of the layout diagram 300 along the cross-line A-A' and the cross-line B-B' correspond to the structures formed above the M3 layers as discussed above in FIG. 2A and in FIG. 2B, respectively. In some embodiments, a length along an X direction of the word lines WL0-WL3 shown in FIG. 3 is substantially equal to a cell width of the bit cells BC as shown in FIG. 1. A width along a Y direction of each of the rows R[0], R[1], R[2] and R[3] shown in FIG. 3 is substantially equal to a cell height of the bit cells BC as shown in FIG. 1. The layout diagram 300 further includes other columns that extend along the X direction and other rows that extend along the Y direction. For simplicity of illustration, only one column and few rows R[0]-R[3] are illustrated in FIG. 3. In some embodiments, the word lines WL0 and WL2 have similar configurations for arranging their own separated segments and vias, and the word lines WL1 and WL3 have similar configurations of the same. As such, similar configurations are not further detailed herein.

In the M3 layer, the segments WL0-2 of the word line WL0 and WL1-4 of the word line WL1 extend along the X direction, and are separated from each other in the Y direction. In the M4 layer, the segments WL1-5a and WL1-5b of the word line WL1 extend along the Y direction, and are separated from each other in the X direction. Edges of the segments WL1-5a and WL1-5b along the Y direction are substantially overlapped and aligned with boundaries of the corresponding bit cells BC as shown in FIG. 1, in some embodiments. In the M5 layer, the segments WL1-2 of the word line WL1 extends along the X direction. Between the M3 and M4 layer, the vias V3-1 and V3-2 are shaped as squares, and are separated from each other in the X direction. Between the M4 and M5 layer, the vias V4-1 and V4-2 are shaped as squares, and are separated from each other in the X direction. In the Y direction, the via V4-1 is further separated from the via V3-1, and the via V4-2 is further separated from the via V3-2.

With reference to FIGS. 2B and 3, the segment WL1-2 is disposed above the remaining segments and vias of the word line WL1. In a layout view in FIG. 3, in some embodiments, the segment WL1-2 is partially overlapped with the segments WL1-4, WL1-5a and WL1-5b. The segment WL1-2 is further partially overlapped with the segment WL0-2 of the word line WL0. Alternatively stated, the segment WL1-2 is overlapped with the segments WL1-4 of the word line WL1 and the segments WL0-2 of the word line WL0 with an offset along the Y direction. Also, the segment WL1-2 is overlapped with parts of the segments WL1-5a and WL1-5b of the word line WL1. In addition, the segment WL1-2 is overlapped with the parts of the vias V3-1 and V3-2, and is overlapped with the entire vias V4-1 and V4-2.

Furthermore, the segment WL1-5a is partially overlapped with the segments WL0-2 and WL1-4, and is entirely overlapped with the vias V3-1 and V4-1. The segment WL1-5b is partially overlapped with the segments WL0-2 and WL1-4, and is entirely overlapped with the vias V3-2 and V4-2.

The configuration of the word lines WL0-WL3 shown in FIG. 3 is given for illustrative purposes. Various configurations of the word lines WL0-WL3 shown in FIG. 3 are within the contemplated scope of the present disclosure.

Figure 4A:
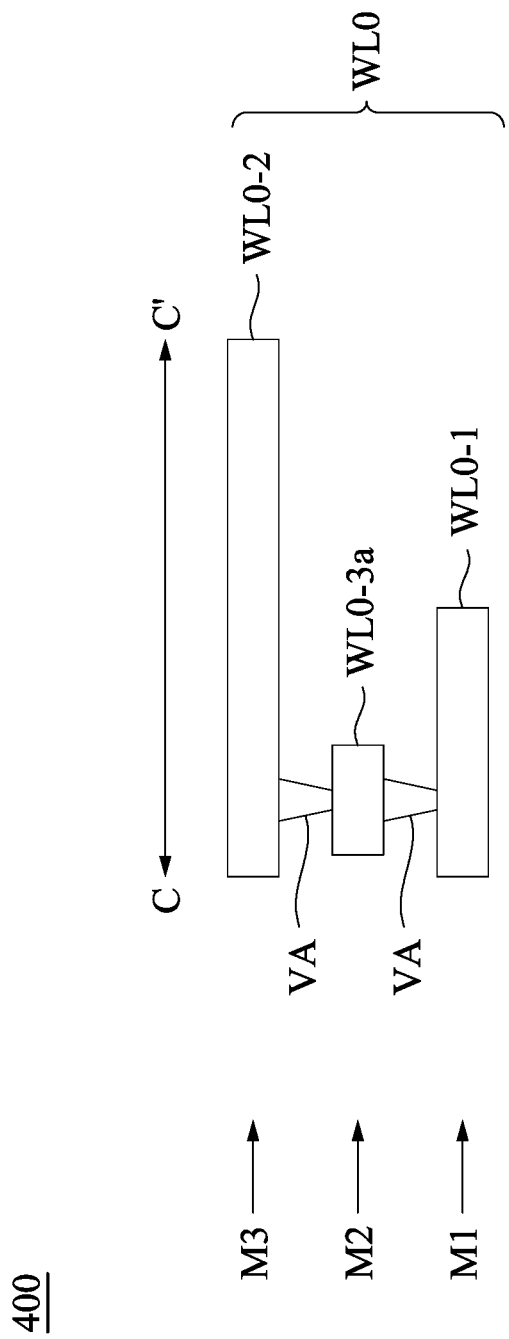
FIGS. 4A and 4B are cross-section schematic diagrams of parts of a memory device corresponding to the memory device shown in FIG. 3, in accordance with some embodiments of the present disclosure.
Figure 4B:
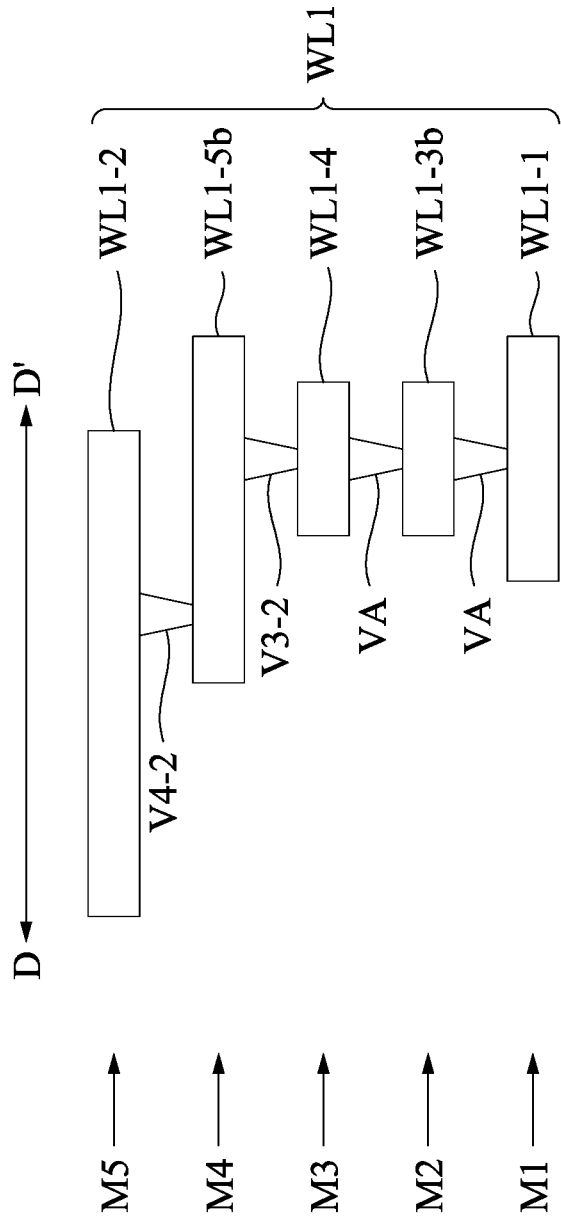

Reference is made to FIGS. 4A and 4B. FIGS. 4A and 4B are cross-section schematic diagrams of parts of a memory device 400 corresponding to the memory device illustrated as the layout diagram 300 shown in FIG. 3, in accordance with some embodiments of the present disclosure. The memory device illustrated as the layout diagram 300 shown in FIG. 3 also corresponds to the memory device 200 shown in FIGS. 2A and 2B, thereby like elements in FIGS. 4A and 4B being designated with the same reference numbers with respect to the embodiments of FIGS. 2A-3, for ease of understanding.

FIG. 4A illustrates a cross section view, viewing at a cross line C-C' shown in FIG. 3, and only illustrates elements that are associated with the word line WL0. As illustrated in FIG. 4A, the segments WL0-1, WL0-3a and WL0-2 are formed in the M1-M3 layers respectively, and contact through vias VA together, as discussed above with reference to FIG. 2A. The segments WL0-2 is disposed above and overlapped with the segments WL0-3a and WL0-1 entirely.

FIG. 4B illustrates a cross section view, viewing at a cross line D-D' shown in FIG. 3, and only illustrates elements that are associated with the word line WL1. As illustrated in FIG. 4B, the segments WL1-1, WL1-3b, WL1-4, WL1-5b and WL1-2 are formed in the M1-M5 layers respectively, and contact through vias VA, V3-2 and V4-2 together, as discussed above with reference to FIG. 2B. The segments WL1-2 is disposed above and offset the segments WL1-1, WL1-3b, WL1-4 and WL1-5b, thereby partially overlapped with these segments as discussed above with reference to FIG. 3.

In some embodiments, as the segments shown in FIGS. 2A-4B have heights along a Z direction (not shown) that are the same, sizes of the segments are referred to as areas. With reference back to FIGS. 3 and 4A, since the cross line C-C' extends along the Y direction, a length of the segment WL0-2 along the cross line C-C' shown in FIG. 4A corresponds to a width of the segment WL0-2 along the Y direction shown in FIG. 3, in some embodiments. Thereby, a width of the segment WL0-2 is greater than a width of the segments WL0-3a or WL0-1, in some embodiments. Similarly, with reference back to FIGS. 3 and 4B, since the cross line D-D' extends along the Y direction, a length of the segment WL1-2 along the cross line D-D' shown in FIG. 4B corresponds to a width of the segment WL1-2 along the Y direction shown in FIG. 3, in some embodiments. A width of the segment WL1-2 is greater than a width of at least one of the segments WL1-1, WL1-3b, WL1-4 and WL1-5b, in some embodiments.

The segments WL0-1 and WL1-1 in the M1 layer is coupled to the corresponding bit cells BC0 and BC1, as discussed with reference to FIGS. 2A-2B. In some embodiments, with reference to FIGS. 2A to 4B, these segments of the word lines WL0-1 and WL1-1 that contact with the corresponding bit cell BC0 or BC1 are indicated as base segments. The base segment is referred to as a portion of the corresponding word lines WL0 or WL1 that is formed in the lowest metal layer and contacts to the bit cells BC0 or BC1. In addition, the segments WL0-2 in the M3 layer and WL1-2 in the M5 layer are indicated as roof segments. The roof segment is referred to as a portion of the corresponding word lines WL0 or WL1 that is formed in the highest metal layer. The remaining segments including, for example, the segments WL0-3a, WL0-3b, WL1-3a and WL1-3b in the M2 layer, the segments WL1-4 in the M3 layer, and the segments WL1-5a and WL1-5b in the M4 layer, are indicated as interconnection segments. The interconnection segment is referred to as a portion of the corresponding word lines WL0 or WL1 that is formed between the highest and the lowest metal layers, and coupled between the base segment and the roof segment. Sizes/areas of the base segment, the interconnection segment, and the roof segment of the word line WL0 or WL1 are further detailed below, in various embodiments.

In some embodiments, at least two segments of the word lines in various metal layers have sizes/areas that are different from each other. For each of the word lines, at least two of the interconnection segment, the base segment, and the roof segment have sizes/areas that are different from each other, as discussed below.

For each of the word lines, in some embodiments, the interconnection segment has an area that is different from an area of the roof segment, and is further different from an area of the base segment. For example, with reference to FIGS. 2A to 4B, for the word line WL0, lengths of the segments WL0-1, WL0-2, and WL0-3a, along the X direction are substantially the same, as illustrated in FIG. 2A. A width of the segment WL0-3a along the Y direction is smaller than a width of each of the segments WL0-1 and WL0-2, as illustrated in FIG. 4A. Thereby, an area of the segment WL0-3a is smaller than an area of the segment WL0-1, and is also smaller than an area of the segment WL0-2. Alternatively stated, an area of at least one of the interconnection segments is smaller than an area of the base segment or the roof segment. In another way to explain, the base segment or the roof segment has a size that is greater than a size of each of the interconnection segments, as these segments have the same height along the Z direction (not illustrated). As such, the size of the segment of the embodiments of the present disclosure is referred to as the area hereinafter.

Furthermore, in some embodiments, for the word line WL1, lengths of the segments WL1-1, WL1-2 and WL1-4 along the X direction are substantially the same, as illustrated in FIG. 2B. A width of the segment WL1-4 along the Y direction is smaller than a width of each of the segments WL1-1 and WL1-2, as illustrated in FIG. 4B. Thereby, an area of the segment WL1-4 is smaller than an area of the segment WL1-1 or WL1-2. In addition, a length of each of the segments WL1-3b and WL1-5b along the Y direction is smaller than a length of the segment WL1-1 or WL1-2, as illustrated in FIG. 4B. A width of each of the segments WL1-3b and WL1-5b along the X direction is smaller than a width of the segment WL1-1 or WL1-2, as illustrated in FIG. 2B. Thereby, an area of the segment WL1-3b or WL1-5b is smaller than an area of the segment WL1-1 or WL1-2.

In some embodiments, the interconnection segment disposed between the lowest and the highest metal layers is also indicated as an internal contact portion of the word line, for coupling the base segment and the roof segment. For example, as illustrated in FIG. 2A, the segments WL0-3a and WL0-3b are configured to couple the segment WL0-1 and the segment WL0-2. In another example, as illustrated in FIG. 2B, the segments WL1-3a, WL1-3b, WL1-4, WL1-5a and WL1-5b are configured to couple the segment WL1-1 and the segment WL1-2. With such configurations, the interconnection segment is further configured to adjust an internal resistance of the corresponding word line by having various areas. Alternatively stated, an equivalent resistance of each of the word line is adjusted by the area of the interconnection segment. The word line including, for example, the word lines WL0 and WL1, have equivalent resistances that are substantially the same with adjustments of respective interconnection segments, in some embodiments.

For each of the word lines, in some embodiments, the base segment has an area that is different from an area of the roof segment. For example, with reference to FIGS. 2A to 4B, for the word line WL0, a width of the segment WL0-1 along the Y direction is smaller than a width of the segment WL0-2, as illustrated in FIG. 4A. Thereby, the segments WL0-1 and WL0-2 have areas that are different from one another, with having the same length as discussed above. Similarly, for the word line WL1, a width of the segment WL1-2 along the Y direction is greater than a width of the segment WL1-1, as illustrated in FIG. 4B, thereby, the segments WL1-1 and WL1-2 having different areas. Alternatively stated, the base segment and the roof segment have sizes that are different from one another.

For two adjacent word lines, in some embodiments, the respective roof segments have areas that are different from each other. For example, as illustrated in FIG. 3, the segment WL0-2 has an area that is greater than an area of the segment WL1-2.

In some embodiments, the base segments of the respective word lines are disposed in a same metal layer which is also indicated as a base metal layer. For example, with reference to FIGS. 2A and 2B, the segments WL0-1 and WL1-1 are both formed in the M1 layer. In other embodiments, the roof segments of the respective word lines are disposed in a different metal layers which are also indicated as roof metal layers. For example, with reference to FIGS. 2A and 2B, the segment WL0-2 is formed in the M3 layer, and the segment WL1-2 is formed in the M5 layer. With such configurations, both of the base segment and the roof segment are also indicated as two main structures coupled with the interconnection segment, for transmitting the corresponding word line signal.

For each of the word lines, in some embodiments, in a same metal layer, at least two segments are separated from each other and have areas that are substantially the same. For example, with reference to FIG. 2A, for the word line WL0, in the M2 layer, the segments WL0-3a and WL0-3b are separated and have areas that are substantially the same. With reference to FIG. 2A, for the word line WL1, the separated segments WL1-3a and WL1-3b in the M2 layer have the same areas. In other examples, with reference to FIGS. 2B and 3, for the word line WL1, the separated segments WL1-5a and WL1-5b in the M4 layer are disposed in parallel to each other. In addition, the segments WL1-5a and WL1-5b have the same areas.

For two adjacent word lines, in some embodiments, in a same metal layer, at least two segments of the corresponding word lines are separated from each other and have areas that are substantially the same. For example, for the word lines WL0-WL3, in the M1 layer, the segments WL0-1 and WL1-1, and the base segments of the word lines WL2 and WL3 (not illustrated) are separated from each other evenly, and have areas that are substantially the same.

For two adjacent word lines, in some embodiments, in a same metal layer, at least two segments of the corresponding word lines are separated from each other and have areas that are different from each other. For example, as illustrated in FIG. 3, in the M3 layer, an area of the segment WL0-2 of the word line WL0 is greater than an area of the segment WL1-4 of the word line WL1.

In some approaches, word lines included in a memory device are formed in the same metal layer, and are arranged in rows sequentially, for transmitting the word line signals to respective bit cells. As such, areas of the word lines are restricted to the row height (i.e., the cell height), and the equivalent resistances of the word lines depend on these areas with negative correlations. Accordingly, the performance of the word lines is affected by the equivalent resistances of the word liens.

Compared to the above approaches, in the embodiments of the present disclosure, for example with reference to FIGS. 2A-4B, separated portions of each of the word lines WL0-WL1 are formed in multiple metal layers. The equivalent resistance of the word lines WL0 or WL1 is reduced because the separated portions of the respective word line WL0 or WL1 are coupled in parallel. Furthermore, portions of the word lines WL0 and WL1 that indicate as the roof segments have a greater area than an area of at least one of the remaining segments of the word lines WL0 and WL1. Thereby, these portions have various areas and also have a certain scheme of arrangements and configurations. Accordingly, for each of the word lines WL0 and WL1, the equivalent resistance is optimized and is able to be adjusted or further reduced.

Figure 5:
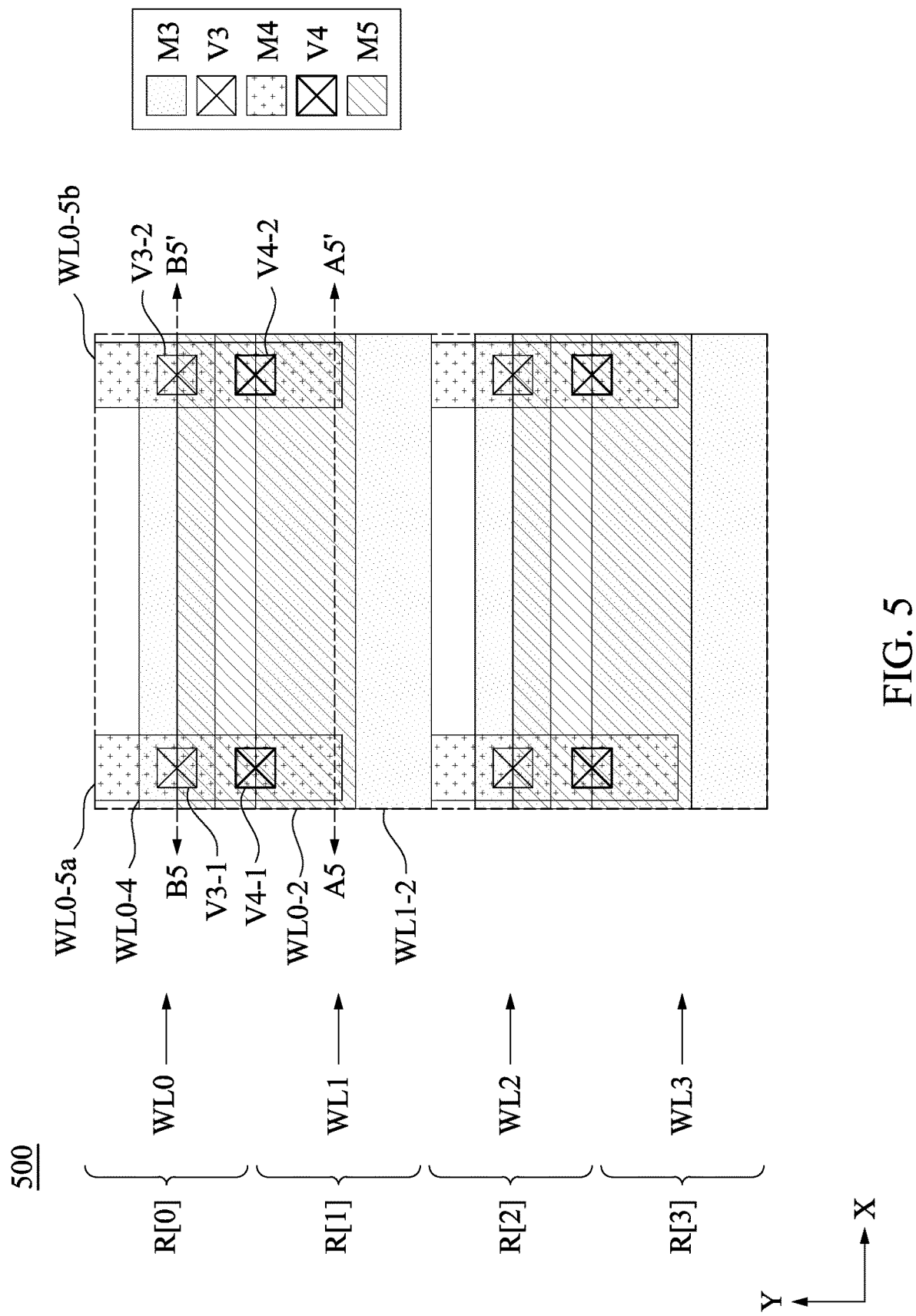
FIG. 5 is a schematic layout diagram of parts of a memory device corresponding to the memory device shown in FIGS. 2A and 2B, in accordance with some embodiments of the present disclosure.

Reference is made to FIG. 5. FIG. 5 is a schematic layout diagram 500 of parts of a memory device corresponding to the memory device 200 shown in FIGS. 2A and 2B, in accordance with some embodiments of the present disclosure. The cross line A5-A5' corresponds to the cross line A-A' shown in FIG. 2A, and the cross line B5-B5' corresponds to the cross line B-B' shown in FIG. 2B, in some embodiments. The layout diagram 500 illustrated in FIG. 5 is an alternative embodiment of the layout diagram 300 illustrated in FIG. 3, as such, similar configurations are not disclosed herein. With respect to the embodiments of FIGS. 2A-3, like elements in FIG. 5 are designated with the same reference numbers for ease of understanding.

Compared to FIG. 3, in the layout diagram 500 shown in FIG. 5, the word line WL0 has multiple segments WL0-1 (not shown) in the M1 layer, WL0-3a and WL0-3b (not shown) in the M2 layer, WL0-4 in the M3 layer, WL0-5a and WL0-5b in the M4 layer, and the WL0-2 in the M5 layer. The word line WL0 further includes vias VA (not shown) between the M1 and M2 layers, and between the M2 and M3 layers, and also includes vias V3-1 and V3-2 between the M3 and M4 layers, and the vias V4-1 and V4-2 between the M4 and M5 layers. The word line WL0 has a configuration for arranging the segments WL0-1, WL0-2, WL0-3a, WL0-3b, WL0-4, WL0-5a and WL0-5b, and the vias VA, V3-1, V3-2, V4-1 and V4-2. This configuration is as same as that of the word line WL1 as illustrated in FIG. 2B, for arranging the segments WL1-1, WL1-2, WL1-3a, WL1-3b, WL1-4, WL1-5a and WL1-5b, and the vias VA, V3-1, V3-2, V4-1 and V4-2. As such, similar configurations are not disclosed herein.

Furthermore, compared to FIG. 3, the word line WL1 in the layout diagram 500 has segments WL1-1 (not shown) in the M1 layer, WL1-3a and WL1-3b (not shown) in the M2 layer, and WL1-2 in the M3 layer. The word line WL1 further includes vias VA (not shown) between the M1 and M2 layers. The word line WL1 has a configuration for arranging the segments WL1-1, WL1-2, WL1-3a and WL1-3b, and the vias VA. This configuration is as same as that of the word line WL0 as illustrated in FIG. 2A, for arranging the segments WL0-1, WL0-2, WL0-3a and WL0-3b, and the vias VA. As such, similar configurations are not disclosed herein.

As illustrated in FIG. 5, in some embodiments, in the M3 layer, an area of the segment WL0-4 is smaller than an area of the segment WL1-2. For the word line WL0, the segment WL0-4 in the M3 layer has an area that is further smaller than an area of the segment WL0-2 in the M5 layer.

Figure 6:
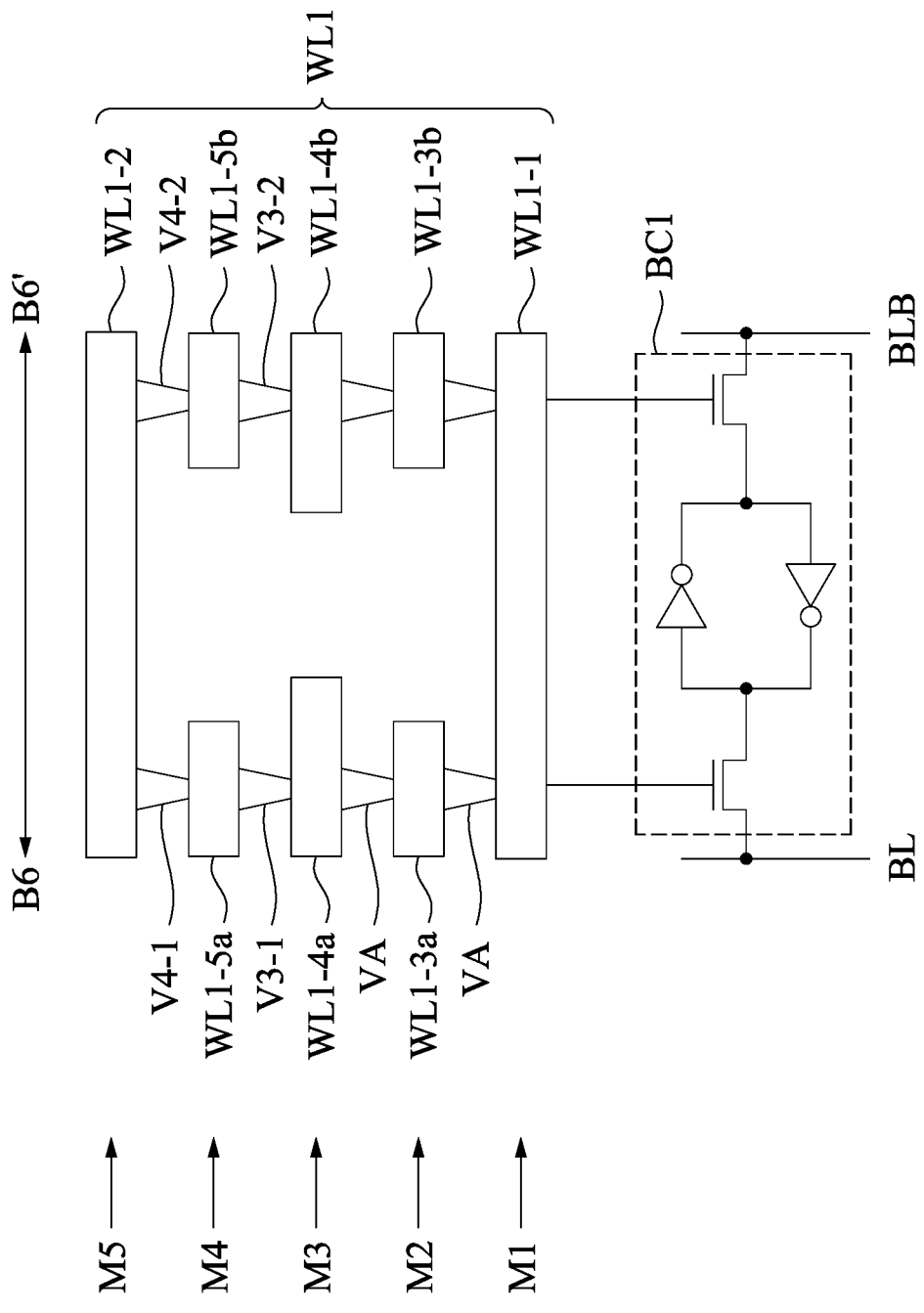
FIG. 6 is a cross-section schematic diagram of parts of a memory device corresponding to the memory device shown in FIG. 1, in accordance with some embodiments of the present disclosure.

Reference is made to FIG. 6. FIG. 6 is a cross-section schematic diagram of parts of a memory device 600 corresponding to the memory device 100 shown in FIG. 1, in accordance with some embodiments of the present disclosure. The memory device 600 illustrated in FIG. 6 is an alternative embodiment of the memory device 200 illustrated in FIGS. 2A-2B, as such, similar configurations are not disclosed herein. With respect to the embodiments of FIGS. 1-2B, like elements in FIG. 6 are designated with the same reference numbers for ease of understanding.

As illustrated in FIG. 6, the word line WL1 contacting to the bit cell BC1 has various segments and vias in the M1-M5 layers. Compared to FIG. 2B, in the memory device 600 shown in FIG. 6, two segments WL1-4a and WL1-4b are formed in the M3 layer, and are separated from each other. Alternatively stated, in the M3 layer, the segment WL1-4 illustrated in FIG. 2B is split into multiple segments WL1-4a and WL1-4b illustrated in FIG. 6. In some embodiments, the segments WL1-4a and WL1-4b are two identical metal structures. In various embodiments, the segments WL1-4a and WL1-4b are indicated as interconnection segments, for coupling the segments WL1-1 and WL1-2, as discussed above.

Figure 7:
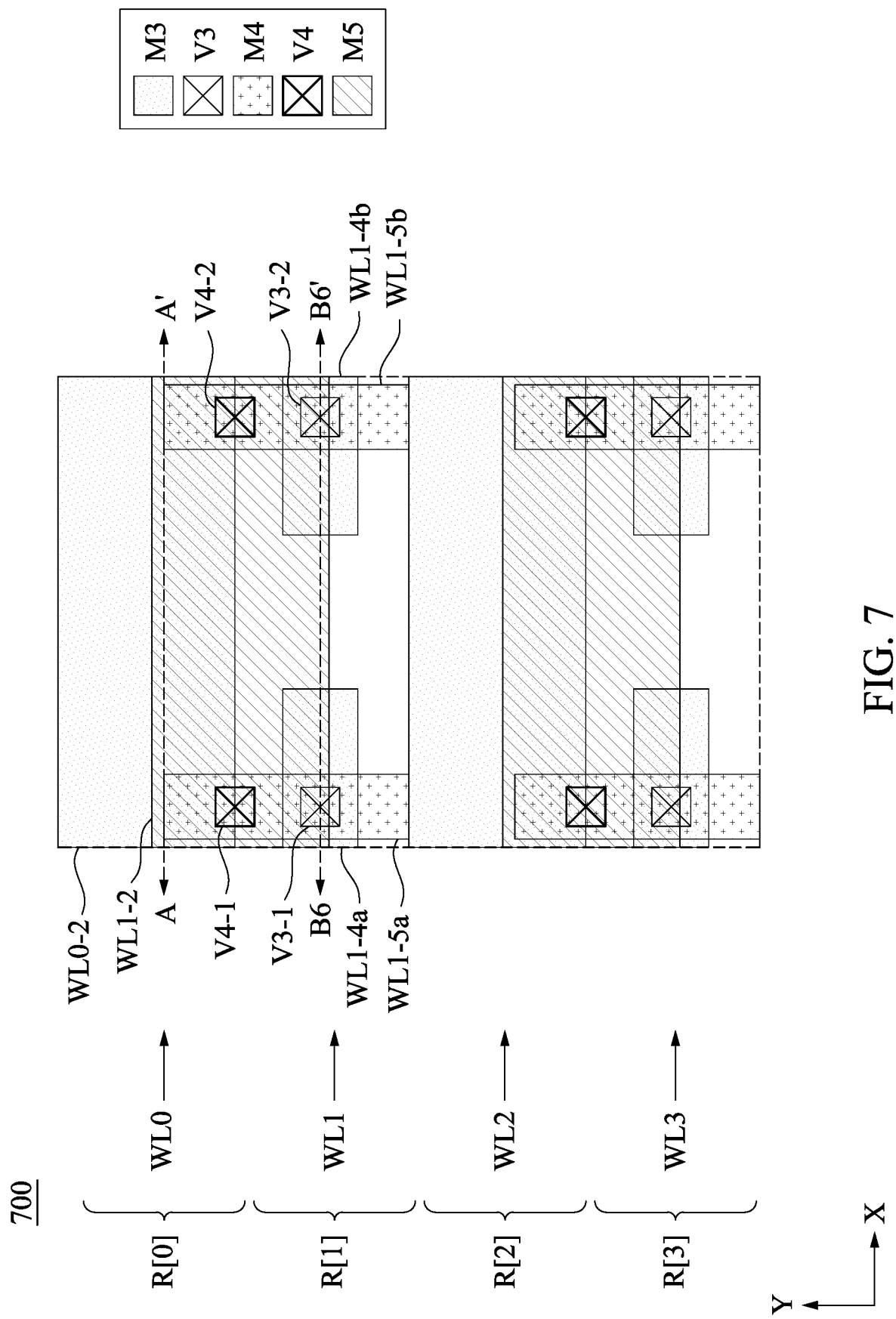
FIG. 7 is a schematic layout diagram of parts of a memory device corresponding to the memory device shown in FIG. 6, in accordance with some embodiments of the present disclosure.

Reference is made to FIG. 7. FIG. 7 is a schematic layout diagram 700 of parts of a memory device corresponding to the memory device 600 shown in FIG. 6 and the memory device 200 shown in FIG. 2A, in accordance with some embodiments of the present disclosure. The cross line A-A' corresponds to the cross line A-A' shown in FIG. 2A, and the cross line B6-B6' corresponds to the cross line B6-B6' shown in FIG. 6, in some embodiments. The layout diagram 700 illustrated in FIG. 7 is an alternative embodiment of the layout diagram 300 illustrated in FIG. 3, as such, similar configurations are not disclosed herein. With respect to the embodiments of FIGS. 2A, 3 and 6, like elements in FIG. 7 are designated with the same reference numbers for ease of understanding.

Compared to FIG. 3, in the layout diagram 700 shown in FIG. 7, the segments WL1-4a and WL1-4b extend along the X direction, and are separated from each other in the X direction. The segment WL1-4a, the segment WL1-5a and the via V3-1 are overlapped. The segment WL1-4b, the segment WL1-5b and the via V3-2 are overlapped. The segment WL1-2 is partially overlapped with the segments WL0-2 of the word line WL0, the segments WL1-4a, WL1-4b, WL1-5a and WL1-5b of the word line WL1, and a space between the segments WL1-4a and WL1-4b.

As illustrated in FIG. 7, in some embodiments, the segments WL1-4a and WL1-4b have areas that are substantially the same. Specifically, in the X direction, a length of the segment WL1-4a is substantially equal to a length of the segment WL1-4b. In the Y direction, a width of the segment WL1-4a is substantially equal to a width of the segment WL1-4b. In some other embodiments, along the X direction, the segments WL1-4a and WL1-4b and the space between the segments WL1-4a and WL1-4b have lengths that are substantially the same. Alternatively stated, a length of the segment WL1-4a or WL1-4b is substantially equal to one cell width of the bit cells BC as shown in FIG. 1 divided by three, in some embodiments. It is also substantially equal to one cell width subtracted a specific length of the blank space between the segments WL1-4a and WL1-4b, and then divided by an amount of the segments WL1-4a and WL1-4b, in other embodiments. In another way to explain, a length of the segment WL1-4a or WL1-4b at least depends on the cell width and an amount of these segments in the M3 layer.

In some embodiments, in another column that is disposed next to the column as illustrated in FIG. 7, the word lines WL0-WL3 have the same arrangements and configurations. Alternatively stated, along the X direction, the word lines WL0-WL3 extend and are duplicated. With such configurations, an amount of the segment WL1-4a or WL1-4b in the M3 layer is substantially equal to an amount of the bit cells arranged in one column and one of the rows R[0]-R[4]. With reference to FIG. 7, an amount of the segment WL1-4a or WL1-4b is one. An amount of the bit cells arranged in such column and the row R[1], which is, the bit cell BC1 shown in FIG. 6, is also be one. Thereby, an amount of the segment WL1-4a or WL1-4b is equal to an amount of the column and the row R[1]. In some other embodiments, an amount of the split segments of one word line in a same layer is greater than an amount of the bit cells arranged in one of the rows R[0]-R[4]. For example, with reference to FIG. 7, an amount of the split segments WL1-4a, WL1-4b, and other duplicated segments (not illustrated) of the word line WL1 in the M3 layer is greater than an amount of the bit cells arranged in the row R[1].

Figure 8:
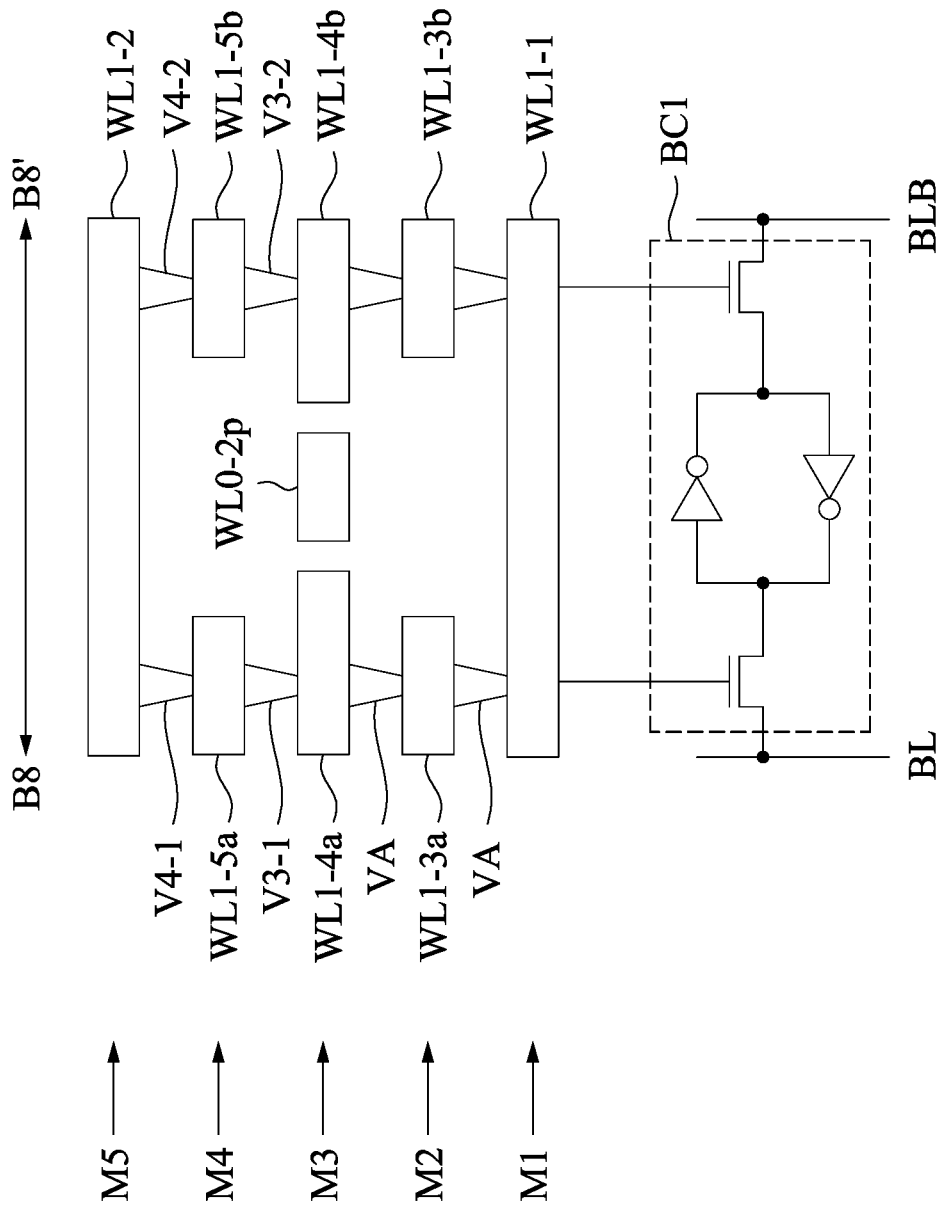
FIG. 8 is a cross-section schematic diagram of parts of a memory device corresponding to the memory device shown in FIG. 1, in accordance with some embodiments of the present disclosure.

Reference is made to FIG. 8. FIG. 8 is a cross-section schematic diagram of parts of a memory device 800 corresponding to the memory device 100 shown in FIG. 1, in accordance with some embodiments of the present disclosure. The memory device 800 illustrated in FIG. 8 is an alternative embodiment of the memory device 600 illustrated in FIG. 6, as such, similar configurations are not disclosed herein. With respect to the embodiments of FIGS. 1 and 6, like elements in FIG. 8 are designated with the same reference numbers for ease of understanding.

Compared to FIG. 6, in the memory device 800 shown in FIG. 8, one part WL0-2p of the word line WL0 is illustrated as a segment, and is formed in the M3 layer. The segment WL0-2p is disposed between the segments WL1-4a and WL1-4b, and is separated from the segments WL1-4a and WL1-4b.

Figure 9:
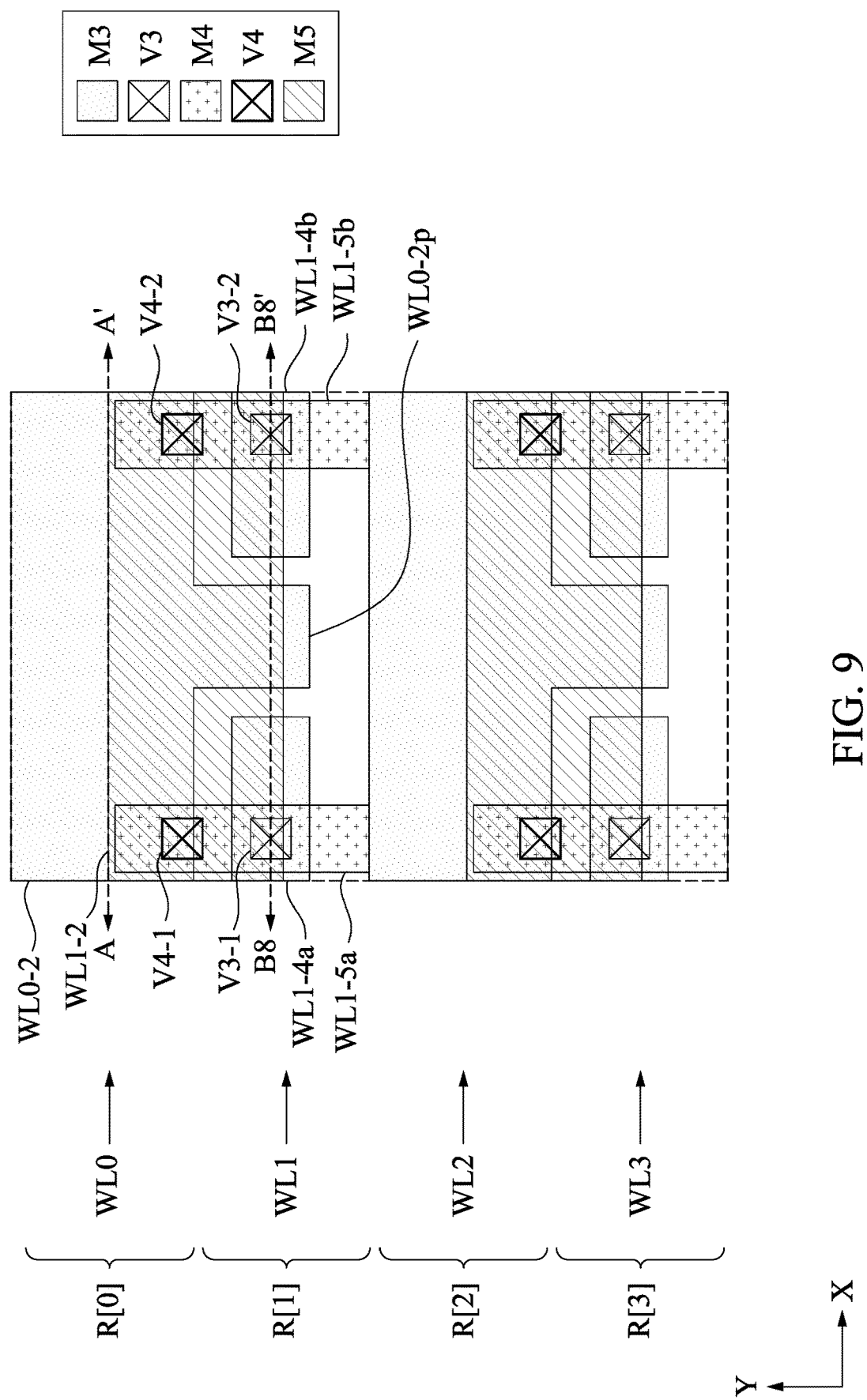
FIG. 9 is a schematic layout diagram of parts of a memory device corresponding to the memory device shown in FIG. 8, in accordance with some embodiments of the present disclosure.

Reference is made to FIG. 9. FIG. 9 is a schematic layout diagram 900 of parts of a memory device corresponding to the memory device 800 shown in FIG. 8, and the memory device 200 shown in FIG. 2A, in accordance with some embodiments of the present disclosure. The cross line A-A' corresponds to the cross line A-A' shown in FIG. 2A, and the cross line B8-B8' corresponds to the cross line B8-B8' shown in FIG. 8, in some embodiments. The layout diagram 900 illustrated in FIG. 9 is an alternative embodiment of the layout diagram 700 illustrated in FIG. 7, as such, similar configurations are not disclosed herein. With respect to the embodiments of FIGS. 2A, 7 and 8, like elements in FIG. 9 are designated with the same reference numbers for ease of understanding.

Compared to FIG. 7, in the layout diagram 900 shown in FIG. 9, the segment WL0-2 of the word line WL0 further has a protruding part WL0-2p that extends along the Y direction. The segment WL0-2 is shaped as an alphabet "T", in some embodiments. As illustrated in FIG. 9, the protruding part WL0-2p is disposed between the segments WL1-4a and WL1-4b. The segment WL1-2 is partially overlapped with the protruding part WL0-2p of the word line WL0, the segments WL1-4a, WL1-4b, WL1-5a and WL1-5b of the word line WL1, and is also partially overlapped with the spaces that is disposed between the segments WL1-4a, WL1-4b and the protruding part WL0-2p.

In a same metal layer, in some embodiments, an area of the segments of the word line WL0 is different from an area of the segments of the word line WL1. Specifically, as illustrated in FIG. 9, in the M3 layer, a total area of the segment WL0-2 is greater than a total area of the segments WL1-4a and WL1-4b. In addition, compared to the embodiments illustrated in FIG. 7, the roof segment of the word line WL0, which is the segment WL0-2, has a greater area. With such configurations, the word line WL0 has a less equivalent resistance due to a broaden area of the segment WL0-2.

Figure 10:
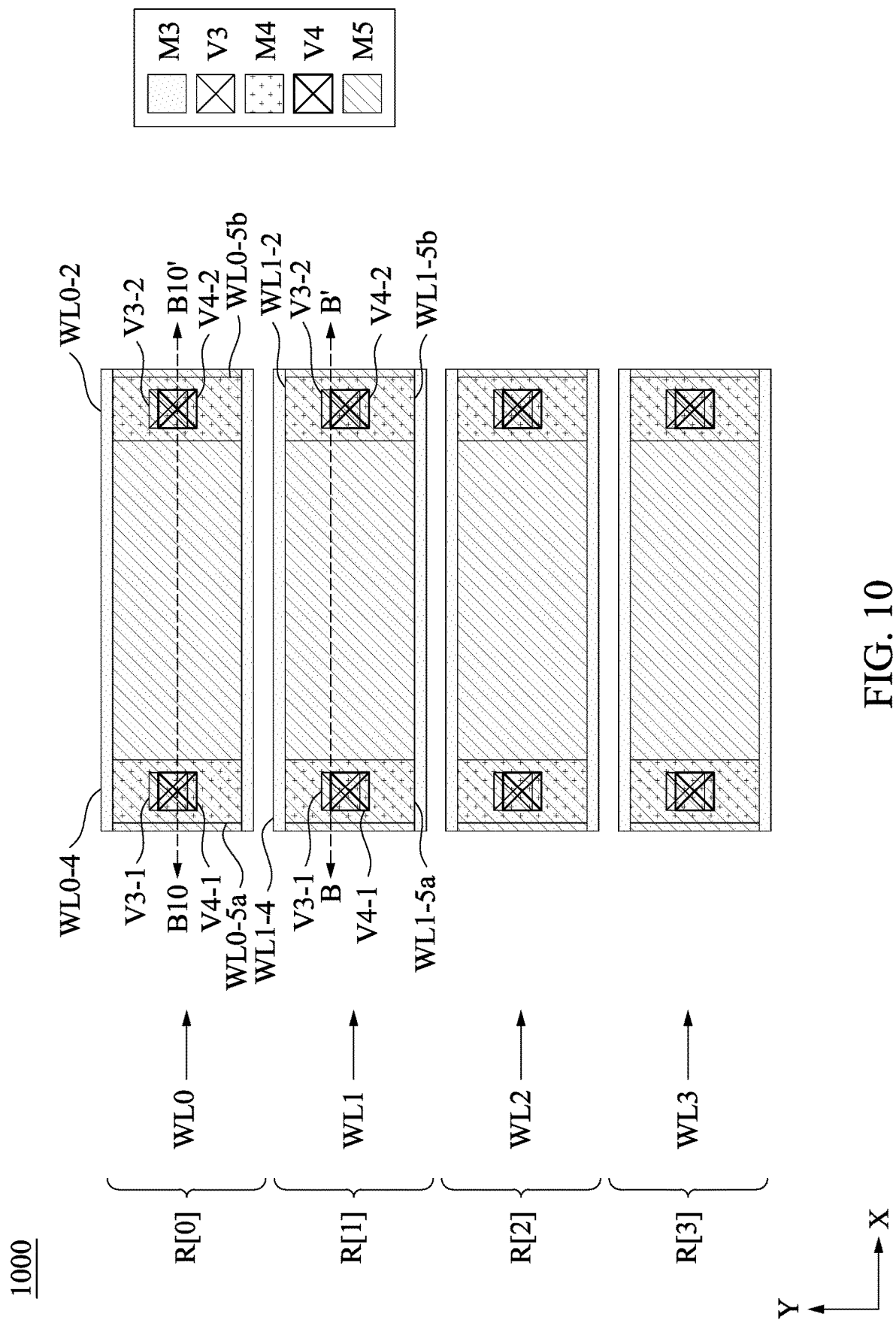
FIG. 10 is a schematic layout diagram of parts of a memory device corresponding to the memory device shown in FIG. 2B, in accordance with some embodiments of the present disclosure.

Reference is made to FIG. 10. FIG. 10 is a schematic layout diagram 1000 of parts of a memory device corresponding to the memory device 200 shown in FIG. 2B, in accordance with some embodiments of the present disclosure. The cross line B10-B10' corresponds to the cross line B-B' shown in FIG. 2B, and the cross line B-B' also corresponds to the cross line B-B' shown in FIG. 2B, in some embodiments. The layout diagram 1000 illustrated in FIG. 10 is an alternative embodiment of the layout diagram 300 illustrated in FIG. 3 or the layout diagram 500 illustrated in FIG. 5, as such, similar configurations are not disclosed herein. With respect to the embodiments of FIGS. 2B, 3 and 5, like elements in FIG. 10 are designated with the same reference numbers for ease of understanding.

Compared to FIG. 3, in the layout diagram 1000 shown in FIG. 10, the word line WL0 has a segment WL0-4 in the M3 layer, segments WL0-5a and WL0-5b in the M4 layer, and a segment WL0-2 in the M5 layer. The segments WL0-4 and WL0-2 extend along the X direction, and the segments WL0-5a and WL0-5b extend along the Y direction. The word line WL0 further has vias V3-1, V3-2, V4-1 and V4-2 that have similar configurations as the same included in the word line WL1. The segment WL0-5a is overlapped with the vias V3-1 and V4-1, and the segment WL0-5b is overlapped with the vias V3-2 and V4-2. The segment WL0-2 is disposed above and overlapped with the segments WL0-5a, WL0-5b and WL0-4, and the vias V3-1, V3-2, V4-1 and V4-2, without offset.

Furthermore, the word lines WL0 and WL1 have similar configurations, in some embodiments. For example, as illustrated in FIG. 10, the segment WL1-2 is also disposed above and overlapped with the segments WL0-5a, WL0-5b and WL0-4, and the vias V3-1, V3-2, V4-1 and V4-2, without offset.

As illustrated in FIG. 10, in some embodiments, for the word line WL0, the segment WL0-2 has an area that is smaller than an area of the segment WL0-4. In some embodiments, a length of the segment WL0-5a or WL0-5b along the Y direction is substantially equal to a width of the segment WL0-2 along the Y direction. Alternatively stated, short edges of the segment WL0-5a or WL0-5b is parallel with and overlapped with long edges of the segment WL0-2. The word line WL1 has similar configurations of the word line WL0, which is not detailed herein. Alternatively stated, in a same metal layer, for two adjacent word lines, the segments of the corresponding word lines have substantially the same areas, in some embodiments. For example, as illustrated in FIG. 10, the segments WL0-4 and WL1-4 in the M3 layer have substantially the same areas, and the segments WL0-2 and WL1-2 in the M5 layer have substantially the same areas as well.

Figure 11:
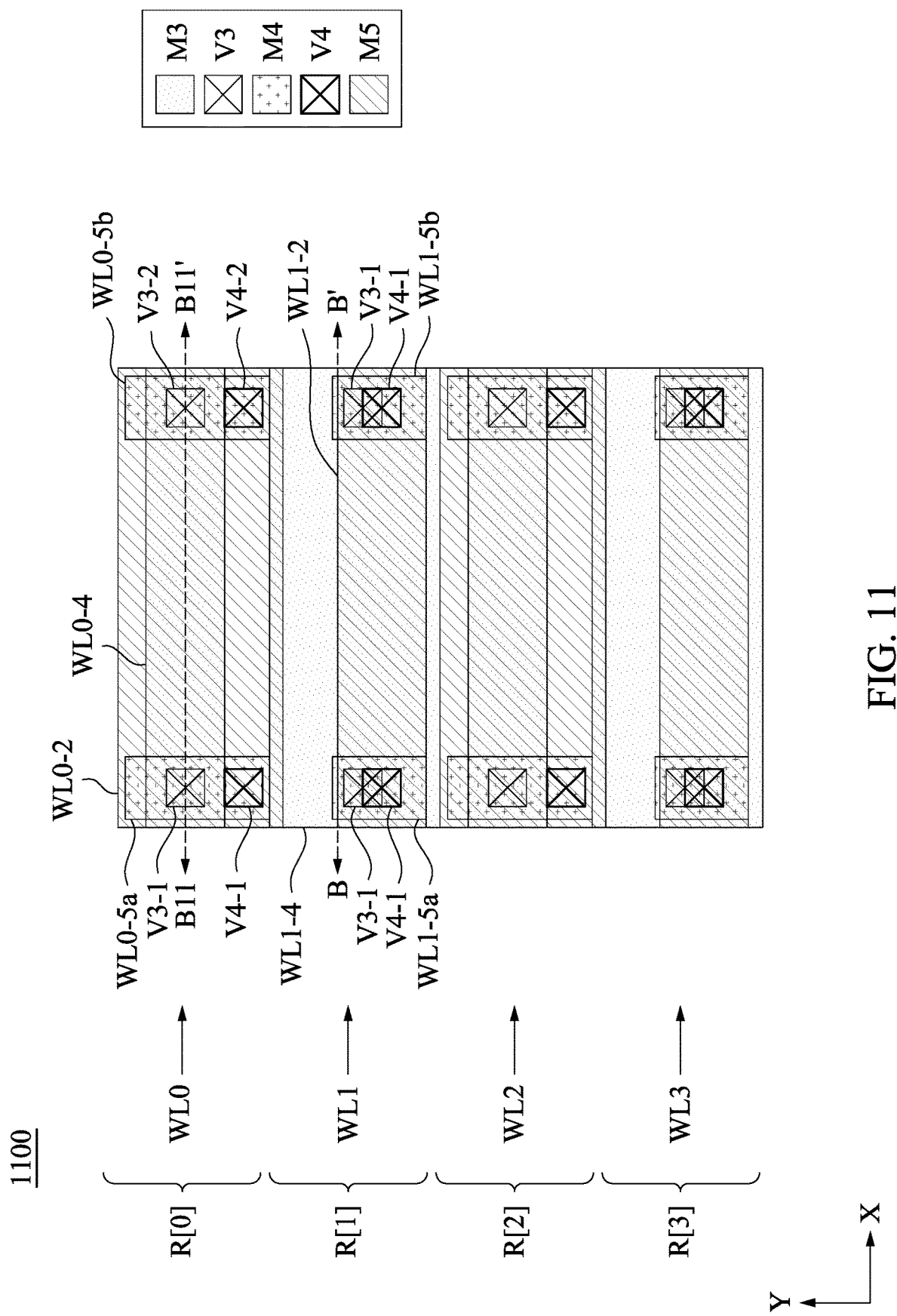
FIG. 11 is a schematic layout diagram of parts of a memory device corresponding to the memory device shown in FIG. 2B, in accordance with some embodiments of the present disclosure.

Reference is made to FIG. 11. FIG. 11 is a schematic layout diagram 1100 of parts of a memory device corresponding to the memory device 200 shown own in FIG. 2B, in accordance with some embodiments of the present disclosure. The cross line B11-B11' corresponds to the cross line B-B' shown in FIG. 2B, and the cross line B-B' also corresponds to the cross line B-B' shown in FIG. 2B, in some embodiments. The layout diagram 1100 illustrated in FIG. 11 is an alternative embodiment of the layout diagram 500 illustrated in FIG. 5 combined with the layout diagram 1000 illustrated in FIG. 10, as such, similar configurations are not disclosed herein. With respect to the embodiments of FIGS. 2B, 5 and 10, like elements in FIG. 11 are designated with the same reference numbers for ease of understanding.

Compared to FIG. 10, in the layout diagram 1100 shown in FIG. 11, the vias V3-1 and V4-1 of the word line WL0 are separated from each other, and the vias V3-2 and V4-2 of the word line WL0 are separated from each other. The segment WL0-4 is directly overlapped with the vias V3-1 and V3-2 without offset, and is partially overlapped with the segments WL0-5a and WL0-5b with offset. The segment WL0-2 is directly overlapped with the remaining segments of the word line WL0 including, for example, the segments WL0-4, WL0-5a and WL0-5b and the vias V3-1, V3-2, V4-1 and 4-2. The segment WL0-2 is further partially overlapped with the segment WL1-4 of the word line WL1. Furthermore, the segment WL1-2 of the word line WL1 is overlapped with a part of the segment WL1-4.

As illustrated in FIG. 11, in some embodiments, in the M3 layer, the segment WL0-4 has an area that is smaller than an area of the segment WL1-4, which is similar to the embodiments illustrated in FIG. 5. In the M4 layer, the segments WL0-5a and WL0-5b have substantially the same areas, and the segments WL1-5a and WL1-5b have substantially the same areas, which is similar to the embodiments illustrated in at least FIG. 5 or 10. Furthermore, an area of the segment WL0-5a or WL0-5b is greater than an area of the segment WL1-5a or WL1-5b. In the M5 layer, the segment WL0-2 has an area that is greater than an area of the segment WL1-2.

In some embodiments, the word line WL0 illustrated in FIGS. 2A-11 is also indicated as an original even word line, and the word line WL1 illustrated in FIGS. 2A-11 is also indicated as an original odd word line. The other word lines arranged in even rows including, for example, the row R[2] and R[4], have the separated segments. These separated segments of the corresponding word lines are arranged in configurations that are the same as the original even word line WL0. Similarly, the other word lines arranged in odd rows including, for example, the row R[3] and R[5], have the separated segments. These separated segments of the corresponding word lines are arranged in configurations that are the same as the original odd word line WL1. Alternatively stated, two adjacent word lines are considered as a group, for forming respective split segments in multiple metal layers, with various areas or shapes that discussed with reference to FIGS. 2A-11.

Figure 12:
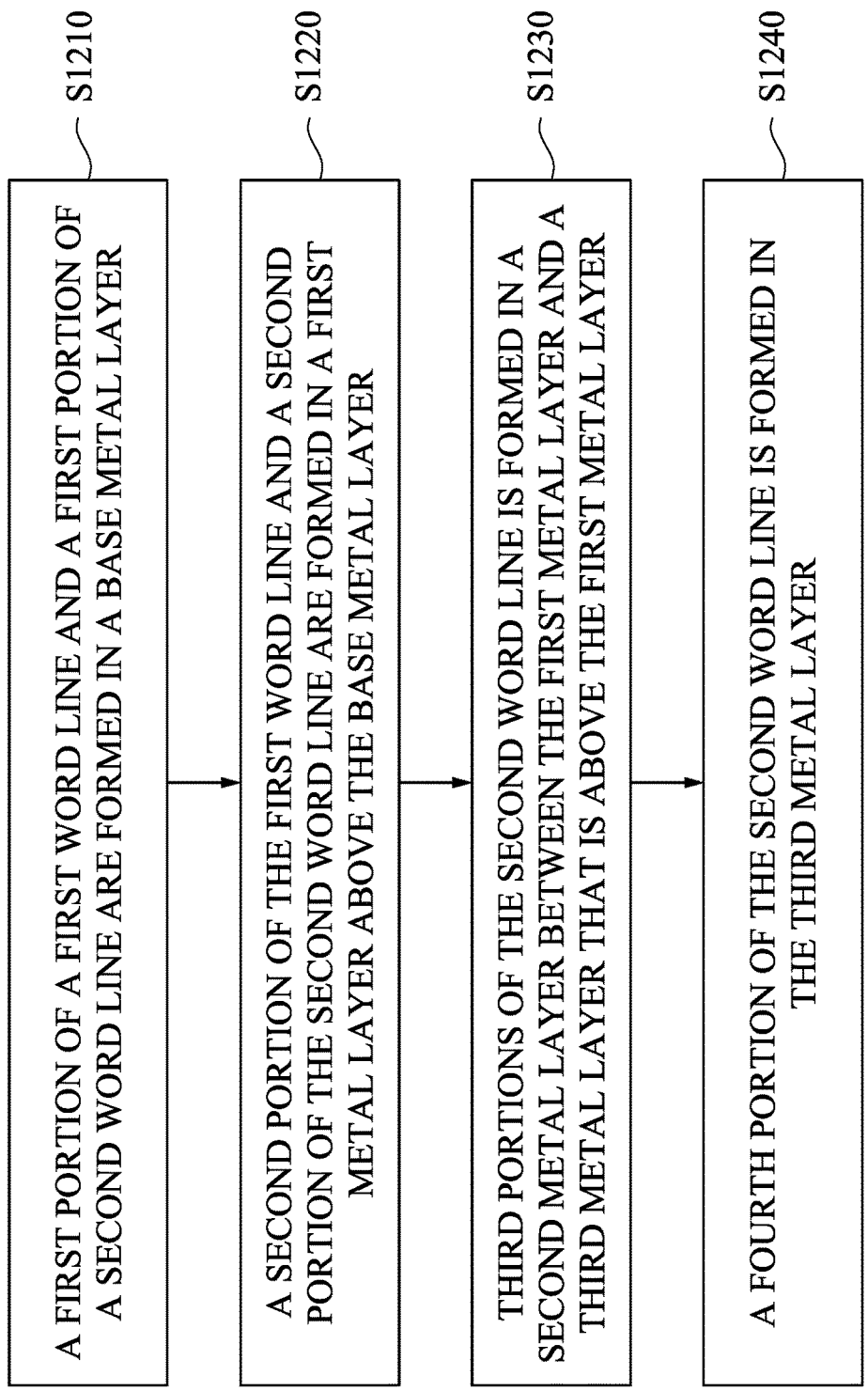
FIG. 12 is a flow chart of a method for generating a memory device, in accordance with some embodiments of the present disclosure.

Reference is made to FIG. 12. FIG. 12 is a flow chart of a method 1200 for generating a memory device corresponding to at least one of the memory device 100 shown in FIG. 1, the memory device 200 shown in FIGS. 2A and 2B, the memory device 400 shown in FIGS. 4A and 4B, the memory device 600 shown in FIG. 6, or the memory device 800 shown in FIG. 8, in accordance with some embodiments of the present disclosure. Following illustrations of the method 1200 in FIG. 12 with reference to the memory device 200 shown in FIGS. 2A and 2B include exemplary operations. However, the operations in FIG. 12 are not necessarily performed in the order shown. Alternatively stated, operations may be added, replaced, changed order, and/or eliminated as appropriate, in accordance with the spirit and scope of various embodiments of the present disclosure.

In operation S1210, a first portion of a first word line and a first portion of a second word line are formed in a base metal layer. The base metal layer corresponds to the M1 layer as illustrated in FIGS. 2A-2B, in the following embodiments. For illustration, as shown in FIGS. 2A and 2B, the segment WL0-1 of the word line WL0 and the segment WL1-1 of the word line WL1 are formed in the M1 layer.

In operation S1220, a second portion of the first word line and a second portion of the second word line are formed in a first metal layer above the base metal layer. The first metal layer corresponds to the M3 layer that is above the M1 layer as illustrated in FIGS. 2A-10, in the following embodiments. For illustration, as shown in FIGS. 2A and 2B, the segment WL0-2 of the word line WL0 is formed in the M3 layer. The segment WL1-4 of the word line WL1 is also formed in the M3 layer.

In operation S1230, third portions of the second word line are formed in a second metal layer between the first metal layer and a third metal layer that is above the first metal layer. The second metal layer corresponds to the M4 layer, and the third metal layer corresponds to the M5 layer, wherein the M4 layer is between the M3 layer and the M5 layer as illustrated in FIGS. 2A-10, in the following embodiments. For illustration, as shown in FIG. 2B, the segments WL1-5a and WL1-5b of the word line WL1 are formed in the M4 layer.

In operation S1240, a fourth portion of the second word line is formed in the third metal layer. The third metal layer corresponds to the M5 layer that is above the M1 layer as illustrated in FIGS. 2A-10, in the following embodiments. For illustration, as shown in FIG. 2B, the segment WL1-2 of the word line WL1 is formed in the M5 layer.

In some embodiments, the method 1200 further includes the following operations. A third portion of the first word line is formed in the second metal layer. For illustration, in some embodiments, with reference to FIG. 11, the segment WL0-2 of the word line WL0, corresponding to the third portion, is formed in the M5 layer, and the segment WL0-4 of the word line WL0, corresponding to the second portion as illustrated in operation S1220, is formed in the M3 layer.

In some embodiments, the method 1200 further includes the following operations. Fourth portions of the first word line are formed in a third metal layer between the first metal layer and the second metal layer. The third metal layer corresponds to the M4 layer that is between the M3 layer and the M5 layer as illustrated in FIGS. 2A-10, in the following embodiments. For illustration, in some embodiments, with reference to FIG. 11, the segments WL0-5a and WL0-5b of the word line WL0 are formed in the M4 layer.

Figure 13:
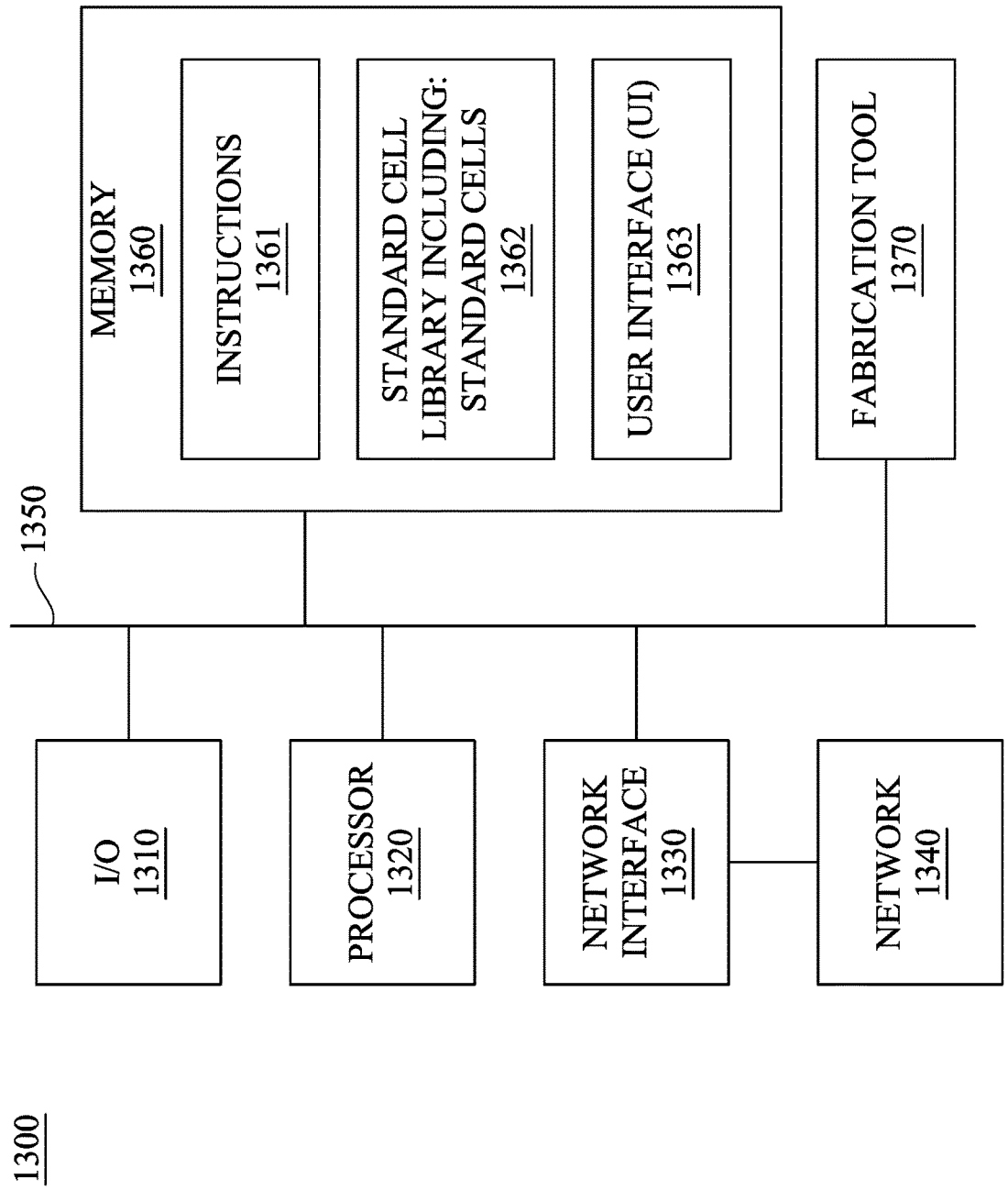
FIG. 13 is a block diagram of a system for designing an IC layout design, in accordance with some embodiments of the present disclosure.

Reference is now made to FIG. 13. FIG. 13 is a block diagram of an electronic design automation (EDA) system 1300 for designing the integrated circuit layout design, in accordance with some embodiments of the present disclosure. EDA system 1300 is configured to implement one or more operations of the method 1200 disclosed in FIG. 12, and further explained in conjunction with FIGS. 2A-11. In some embodiments, EDA system 1300 includes an APR system.

In some embodiments, EDA system 1300 is a general purpose computing device including a hardware processor 1320 and a non-transitory, computer-readable storage medium 1360. Storage medium 1360, amongst other things, is encoded with, i.e., stores, computer program code (instructions) 1361, i.e., a set of executable instructions. Execution of the computer program code (instructions) 1361 by hardware processor 1320 represents (at least in part) an EDA tool which implements a portion or all of, e.g., the method 1200.

The processor 1320 is electrically coupled to computer-readable storage medium 1360 via a bus 1350. The processor 1320 is also electrically coupled to an I/O interface 1310 and a fabrication tool 1370 by bus 1350. A network interface 1330 is also electrically connected to processor 1320 via bus 1350. Network interface 1330 is connected to a network 1340, so that processor 1320 and computer-readable storage medium 1360 are capable of connecting to external elements via network 1340. The processor 1320 is configured to execute computer program code 1361 encoded in computer-readable storage medium 1360 in order to cause EDA system 1300 to be usable for performing a portion or all of the noted processes and/or methods. In one or more embodiments, processor 1320 is a central processing unit (CPU), a multi-processor, a distributed processing system, an application specific integrated circuit (ASIC), and/or a suitable processing unit.

In one or more embodiments, computer-readable storage medium 1360 is an electronic, magnetic, optical, electromagnetic, infrared, and/or a semiconductor system (or apparatus or device). For example, computer-readable storage medium 1360 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1360 includes a compact disk-read only memory (CD-ROM), a compact disk-read/write (CD-R/W), and/or a digital video disc (DVD).

In one or more embodiments, storage medium 1360 stores computer program code 1361 configured to cause EDA system 1300 (where such execution represents (at least in part) the EDA tool) to be usable for performing a portion or all of the noted processes and/or methods. In one or more embodiments, storage medium 1360 also stores information which facilitates performing a portion or all of the noted processes and/or methods. In one or more embodiments, storage medium 1360 stores library 1362 of standard cells including such standard cells as disclosed herein, for example, a cell including word lines WL discussed above with respect to FIG. 1.

EDA system 1300 includes I/O interface 1310. I/O interface 1310 is coupled to external circuitry. In one or more embodiments, I/O interface 1310 includes a keyboard, keypad, mouse, trackball, trackpad, touchscreen, and/or cursor direction keys for communicating information and commands to processor 1320.

EDA system 1300 also includes network interface 1330 coupled to processor 1320. Network interface 1330 allows EDA system 1300 to communicate with network 1340, to which one or more other computer systems are connected. Network interface 1330 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 1300.

EDA system 1300 also includes the fabrication tool 1370 coupled to the processor 1320. The fabrication tool 1370 is configured to fabricate integrated circuits, including, for example, the memory device 100 illustrated in FIG. 1, the memory device 200 illustrated in FIGS. 2A-2B, the memory device 400 illustrated in FIGS. 4A-4B, the memory device 600 illustrated in FIG. 6, and the memory device 800 illustrated in FIG. 8, based on the design files processed by the processor 1320 and/or the IC layout designs as discussed above.

EDA system 1300 is configured to receive information through I/O interface 1310. The information received through I/O interface 1310 includes one or more of instructions, data, design rules, libraries of standard cells, and/or other parameters for processing by processor 1320. The information is transferred to processor 1320 via bus 1350. EDA system 1300 is configured to receive information related to a UI through I/O interface 1310. The information is stored in computer-readable medium 1360 as user interface (UI) 1363.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1300. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 14:
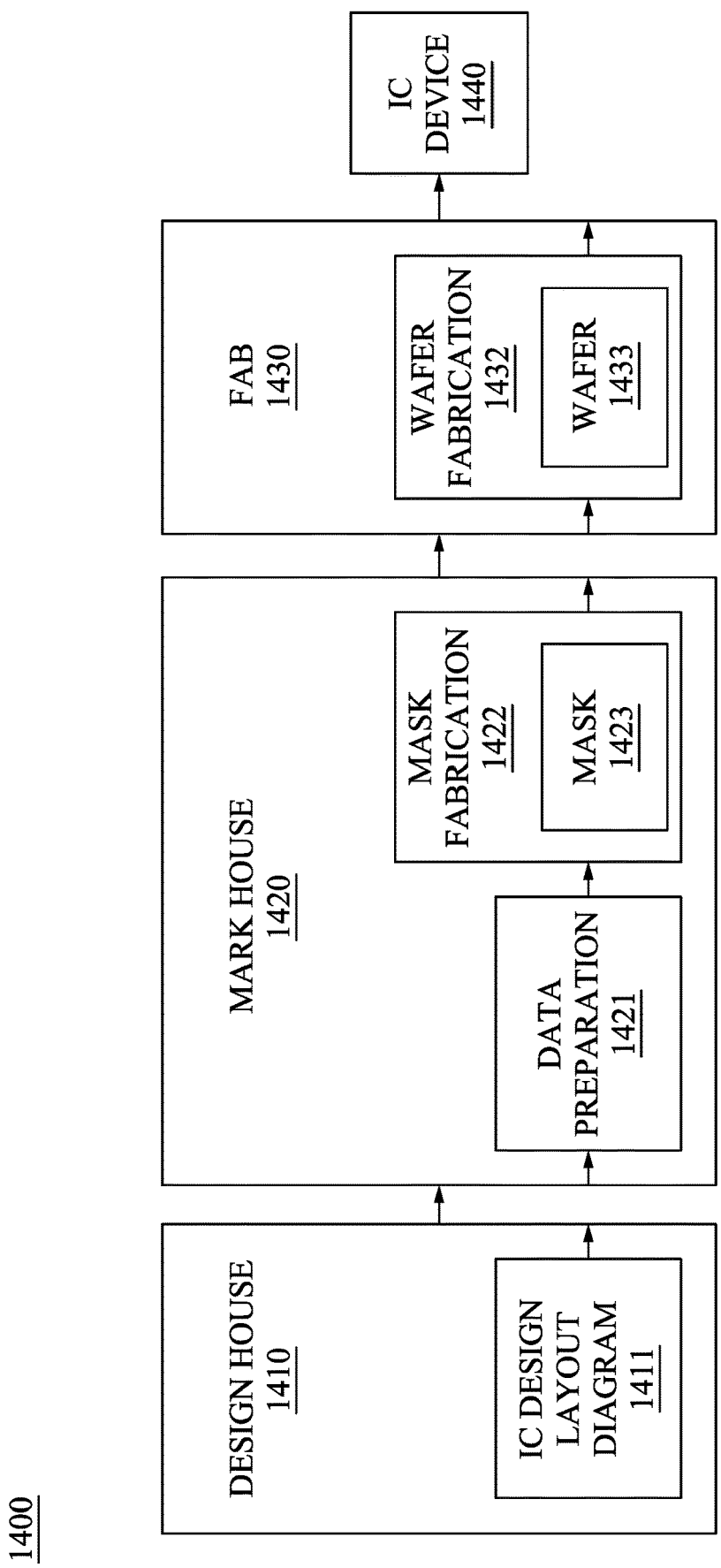
FIG. 14 is a block diagram of an IC manufacturing system, and an IC manufacturing flow associated therewith, in accordance with some embodiments of the present disclosure.

FIG. 14 is a block diagram of IC manufacturing system 1400, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1400.

In FIG. 14, IC manufacturing system 1400 includes entities, such as a design house 1410, a mask house 1420, and an IC manufacturer/fabricator ("fab") 1430, that interact with one another in the design, development, and manufacturing cycles and/or services related to manufacturing an IC device 1440. The entities in IC manufacturing system 1400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1410, mask house 1420, and IC fab 1430 is owned by a single larger company. In some embodiments, two or more of design house 1410, mask house 1420, and IC fab 1430 coexist in a common facility and use common resources.

Design house (or design team) 1410 generates an IC design layout diagram 1411. IC design layout diagram 1411 includes various geometrical patterns, for example, an IC layout design depicted in FIGS. 3, 5, 7 and/or FIGS. 9-11 designed for an IC device 1440, for example, integrated circuits including the memory device 200, 400, 600 and 800 discussed above with respect to FIGS. 2A-2B, FIGS. 4A-4B, FIG. 6, and/or FIG. 8. The geometrical patterns correspond to patterns of metal, oxide, or semiconductor layers that make up the various components of IC device 1440 to be fabricated. The various layers combine to form various IC features. For example, a portion of IC design layout diagram 1411 includes various IC features, such as an active region, gate electrode, source and drain, conductive segments or vias of an interlayer interconnection, to be formed in a semiconductor substrate (such as a silicon wafer) and various material layers disposed on the semiconductor substrate.

Design house 1410 implements a proper design procedure to form IC design layout diagram 1411. The design procedure includes one or more of logic design, physical design or place and route. IC design layout diagram 1411 is presented in one or more data files having information of the geometrical patterns. For example, IC design layout diagram 1411 can be expressed in a GDSII file format or DFII file format.

Mask house 1420 includes mask data preparation 1421 and mask fabrication 1422. Mask house 1420 uses IC design layout diagram 1411 to manufacture one or more masks 1423 to be used for fabricating the various layers of IC device 1440 according to IC design layout diagram 1411. Mask house 1420 performs mask data preparation 1421, where IC design layout diagram 1411 is translated into a representative data file ("RDF"). Mask data preparation 1421 provides the RDF to mask fabrication 1422. Mask fabrication 1422 includes a mask writer. A mask writer converts the RDF to an image on a substrate, such as a mask (reticle) 1423 or a semiconductor wafer 1433. The IC design layout diagram 1411 is manipulated by mask data preparation 1421 to comply with particular characteristics of the mask writer and/or requirements of IC fab 1430. In FIG. 14, data preparation 1421 and mask fabrication 1422 are illustrated as separate elements. In some embodiments, data preparation 1421 and mask fabrication 1422 can be collectively referred to as mask data preparation.

In some embodiments, data preparation 1421 includes optical proximity correction (OPC) which uses lithography enhancement techniques to compensate for image errors, such as those that can arise from diffraction, interference, other process effects and the like. OPC adjusts IC design layout diagram 1411. In some embodiments, data preparation 1421 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1421 includes a mask rule checker (MRC) that checks the IC design layout diagram 1411 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1411 to compensate for limitations during mask fabrication 1422, which may undo part of the modifications performed by OPC in order to meet mask creation rules.

In some embodiments, data preparation 1421 includes lithography process checking (LPC) that simulates processing that will be implemented by IC fab 1430 to fabricate IC device 1440. LPC simulates this processing based on IC design layout diagram 1411 to create a simulated manufactured device, such as IC device 1440. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1411.

It should be understood that the above description of data preparation 1421 has been simplified for the purposes of clarity. In some embodiments, data preparation 1421 includes additional features such as a logic operation (LOP) to modify the IC design layout diagram 1411 according to manufacturing rules. Additionally, the processes applied to IC design layout diagram 1411 during data preparation 1421 may be executed in a variety of different orders.

After data preparation 1421 and during mask fabrication 1422, a mask 1423 or a group of masks 1423 are fabricated based on the modified IC design layout diagram 1411. In some embodiments, mask fabrication 1422 includes performing one or more lithographic exposures based on IC design layout diagram 1411. In some embodiments, an electron-beam (e-beam) or a mechanism of multiple e-beams is used to form a pattern on a mask (photomask or reticle) 1423 based on the modified IC design layout diagram 1411. Mask 1423 can be formed in various technologies. In some embodiments, mask 1423 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1423 includes a transparent substrate (for example, fused quartz) and an opaque material (for example, chromium) coated in the opaque regions of the binary mask. In another example, mask 1423 is formed using a phase shift technology. In a phase shift mask (PSM) version of mask 1423, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1422 is used in a variety of processes. For example, such a mask(s) is used in an ion implantation process to form various doped regions in semiconductor wafer 1433, in an etching process to form various etching regions in semiconductor wafer 1433, and/or in other suitable processes.

IC fab 1430 includes wafer fabrication 1432. IC fab 1430 is an IC fabrication business that includes one or more manufacturing facilities for the fabrication of a variety of different IC products. In some embodiments, IC Fab 1430 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1430 uses mask(s) 1423 fabricated by mask house 1420 to fabricate IC device 1440. Thus, IC fab 1430 at least indirectly uses IC design layout diagram 1411 to fabricate IC device 1440. In some embodiments, semiconductor wafer 1433 is fabricated by IC fab 1430 using mask(s) 1423 to form IC device 1440. In some embodiments, the IC fabrication includes performing one or more lithographic exposures based at least indirectly on IC design layout diagram 1411. Semiconductor wafer 1433 includes a silicon substrate or other proper substrate having material layers formed thereon. Semiconductor wafer 1433 further includes one or more of various doped regions, dielectric features, multi-level interconnects, and the like (formed at subsequent manufacturing steps).

In some embodiments, a memory device is disclosed. The memory device includes a first word line and a second word line. The first word line is configured to transmit a first word line signal to a first set of memory cells. A first portion of the first word line is formed in a first metal layer, a second portion of the first word line is formed in a second metal layer above the first metal layer, and a third portion of the first word line is formed in a third metal layer below the second metal layer. The third portion of the first word line is overlapped with the second portion of the first word line. The second word line is configured to transmit a second word line signal to a second set of memory cells. A first portion of the second word line is formed in the first metal layer. A second portion of the second word line is formed in the second metal layer. The first portion, the second portion, and the third portion of the first word line have sizes that are different from each other, and the first portion and the second portion of the second word line have sizes that are different from each other.

In some embodiments, the third metal layer is between the first metal layer and the second metal layer.

In some embodiments, a width of the third portion of the first word line is smaller than a width of the second portion of the first word line.

In some embodiments, the width of the third portion of the first word line is smaller than a width of the first portion of the first word line.

In some embodiments, the second portion of the second word line includes a plurality of segments that are separated from each other. The at least one part of the second portion of the first word line is disposed between two of the plurality of segments, in a layout view.

In some embodiments, widths of the plurality of segments of the second portion of the second word line are substantially equal to each other.

In some embodiments, the widths of the plurality of segments of the second portion of the second word line is smaller than a width of the first portion of the second word line.

Also disclosed is a memory device which includes a first word line, a second word line, a third word line and a fourth word line. The first word line is configured to transmit a first word line signal to a first set of memory cells arranged in a first row. A first portion of the first word line is formed in a first metal layer, and a second portion of the first word line is formed in a second metal layer above the first metal layer. The second word line is configured to transmit a second word line signal to a second set of memory cells arranged in a second row. A first portion of the second word line is formed in the first metal layer. A second portion of the second word line is formed in the second metal layer. A third portion of the second word line is formed in a third metal layer above the second metal layer. Fourth portions of the second word line are formed in a fourth metal layer between the second metal layer and the third metal layer. The third word line is configured to transmit a third word line signal to a third set of memory cells arranged in a third row. A first portion of the third word line is formed in the first metal layer, and a second portion of the third word line is formed in the second metal layer. The fourth word line is configured to transmit a fourth word line signal to a fourth set of memory cells arranged in a fourth row. A first portion of the fourth word line is formed in the first metal layer. A second portion of the fourth word line is formed in the second metal layer. A third portion of the fourth word line is formed in the third metal layer.

In some embodiments, the fourth portions of the second word line are separated from each other in a first direction and extend along a second direction.

In some embodiments, the fourth portions of the second word line are disposed in parallel to each other.

In some embodiments, the fourth portions of the second word line have the same areas.

In some embodiments, the second portion of the second word line includes a plurality of segments that are separated from each other.

In some embodiments, an amount of the plurality of segments is substantially equal to or greater than an amount of the first set of memory cells or the second set of memory cells arranged in a column and the first row or the second row.

In some embodiments, the plurality of segments of the second portion of the second word line extend in a first direction. A protruding part of the second portion of the first word line extends in a second direction, and is disposed between two of the plurality of segments, in a layout view.

In some embodiments, in the layout view, the protruding part of the second portion of the first word line and the plurality of segments are partially overlapped with the third portion of the second word line.

In some embodiments, the first portion and the second portion of the first word line have sizes that are different from each other. The first portion, the second portion and the third portion of the second word line have sizes that are different from each other. The first portion and the second portion of the third word line have sizes that are different from each other. The first portion, the second portion and the third portion of the fourth word line have sizes that are different from each other. Sizes of the second portion of the first word line and the second portion of the third word line are substantially the same, and are different from sizes of the second portion of the second word line and the second portion of the fourth word line that are substantially the same. The first word line, the second word line, the third word line, and the fourth word line have equivalent resistances that are substantially the same.

In some embodiments, the fourth portions of the second word line are partially overlapped with the second portion of the first word line, the second portion of the second word line, and the third portion of the second word line, in a layout view.

Also disclosed is a memory device which includes a first portion of a first word line, a first portion of a second word line, a second portion of the first word line, a second portion of the second word line, third portions of the second word line, and a fourth portion of the second word line. The first portion of the first word line and the first portion of the second word line are formed in a first metal layer. The second portion of the first word line and the second portion of the second word line are formed in a second metal layer above the first metal layer. The third portions of the second word line are formed in a third metal layer between the second metal layer and a fourth metal layer that is above the second metal layer. The fourth portion of the second word line is formed in the fourth metal layer. The first portion and the second portion of the first word line have sizes that are different from each other, and at least two of the first portion, the second portion, the third portions and the fourth portion of the second word line have sizes that are different from each other. At least one part of the second portion of the first word line is disposed between two segments of the second portion of the second word line that are separated from each other.

In some embodiments, widths of the two segments of the second portion of the second word line are substantially equal to each other.

In some embodiments, the two segments of the second portion of the second word line extend in a first direction, and the at least one part of the second portion of the first word line extends in a second direction, in a layout view. The second direction and the first direction are perpendicular to each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a first word line configured to transmit a first word line signal to a first set of memory cells, wherein a first portion of the first word line is formed in a first metal layer, a second portion of the first word line is formed in a second metal layer above the first metal layer, and a third portion of the first word line is formed in a third metal layer below the second metal layer, wherein the third portion of the first word line is overlapped with the second portion of the first word line; and
a second word line configured to transmit a second word line signal to a second set of memory cells, wherein a first portion of the second word line is formed in the first metal layer, and a second portion of the second word line is formed in the second metal layer,
wherein the first portion, the second portion, and the third portion of the first word line have sizes that are different from each other, and the first portion and the second portion of the second word line have sizes that are different from each other,
wherein the size of the third portion of the first word line is smaller than the size of the first portion of the first word line,
wherein the second portion of the first word line is partially overlapped with the second portion of the second word line.

2. The memory device of claim 1, wherein the third metal layer is between the first metal layer and the second metal layer.

3. The memory device of claim 1, wherein a width of the third portion of the first word line is smaller than a width of the second portion of the first word line.

4. The memory device of claim 3, wherein the width of the third portion of the first word line is smaller than a width of the first portion of the first word line.

5. The memory device of claim 1, wherein the second portion of the second word line comprises a plurality of segments that are separated from each other,
wherein at least one part of the second portion of the first word line is disposed between two of the plurality of segments, in a layout view.

6. The memory device of claim 5, wherein widths of the plurality of segments of the second portion of the second word line are substantially equal to each other.

7. The memory device of claim 6, wherein the widths of the plurality of segments of the second portion of the second word line are smaller than a width of the first portion of the second word line.

8. A memory device, comprising:
a first word line configured to transmit a first word line signal to a first set of memory cells arranged in a first row, wherein a first portion of the first word line is formed in a first metal layer, and a second portion of the first word line is formed in a second metal layer above the first metal layer, wherein the first portion of the first word line is overlapped by the second portion of the first word line entirely;
a second word line configured to transmit a second word line signal to a second set of memory cells arranged in a second row, wherein a first portion of the second word line is formed in the first metal layer, a second portion of the second word line is formed in the second metal layer, a third portion of the second word line is formed in a third metal layer above the second metal layer, and fourth portions of the second word line are formed in a fourth metal layer between the second metal layer and the third metal layer;
a third word line configured to transmit a third word line signal to a third set of memory cells arranged in a third row, wherein a first portion of the third word line is formed in the first metal layer, and a second portion of the third word line is formed in the second metal layer; and
a fourth word line configured to transmit a fourth word line signal to a fourth set of memory cells arranged in a fourth row, wherein a first portion of the fourth word line is formed in the first metal layer, a second portion of the fourth word line is formed in the second metal layer, and a third portion of the fourth word line is formed in the third metal layer,
wherein the fourth portions of the second word line are partially overlapped with the second portion of the first word line.

9. The memory device of claim 8, wherein the fourth portions of the second word line are separated from each other in a first direction and extend along a second direction.

10. The memory device of claim 8, wherein the fourth portions of the second word line are disposed in parallel to each other.

11. The memory device of claim 8, wherein the fourth portions of the second word line have the same areas.

12. The memory device of claim 8, wherein the second portion of the second word line comprises a plurality of segments that are separated from each other.

13. The memory device of claim 12, wherein an amount of the plurality of segments is substantially equal to or greater than an amount of the first set of memory cells or the second set of memory cells arranged in a column and the first row or the second row.

14. The memory device of claim 12, wherein
the plurality of segments of the second portion of the second word line extend in a first direction, and
a protruding part of the second portion of the first word line extends in a second direction, and is disposed between two of the plurality of segments, in a layout view.

15. The memory device of claim 14, wherein in the layout view, the protruding part of the second portion of the first word line and the plurality of segments are partially overlapped with the third portion of the second word line.

16. The memory device of claim 8, wherein
the first portion and the second portion of the first word line have sizes that are different from each other,
the first portion, the second portion and the third portion of the second word line have sizes that are different from each other,
the first portion and the second portion of the third word line have sizes that are different from each other,
the first portion, the second portion and the third portion of the fourth word line have sizes that are different from each other,
sizes of the second portion of the first word line and the second portion of the third word line are substantially the same, and are different from sizes of the second portion of the second word line and the second portion of the fourth word line that are substantially the same, and
the first word line, the second word line, the third word line, and the fourth word line have equivalent resistances that are substantially the same.

17. The memory device of claim 8, wherein the fourth portions of the second word line are partially overlapped with the second portion of the second word line, and the third portion of the second word line, in a layout view.

18. A memory device, comprising:
a first portion of a first word line and a first portion of a second word line formed in a first metal layer;
a second portion of the first word line and a second portion of the second word line formed in a second metal layer above the first metal layer;
third portions of the second word line formed in a third metal layer between the second metal layer and a fourth metal layer that is above the second metal layer;
a fourth portion of the second word line formed in the fourth metal layer; and
a third portion of the first word line formed in a fifth metal layer,
wherein the first portion and the second portion of the first word line have sizes that are different from each other, and at least two of the first portion, the second portion, the third portions and the fourth portion of the second word line have sizes that are different from each other,
wherein at least one part of the second portion of the first word line is disposed between two segments of the second portion of the second word line that are separated from each other,
wherein a size of the third portion of the first word line is smaller than the size of the first portion of the first word line.

19. The memory device of claim 18, wherein widths of the two segments of the second portion of the second word line are substantially equal to each other.

20. The memory device of claim 18, wherein the two segments of the second portion of the second word line extend in a first direction, and the at least one part of the second portion of the first word line extends in a second direction, in a layout view, wherein the second direction and the first direction are perpendicular to each other.

* * * * *